(12) United States Patent
Takai et al.

(10) Patent No.: US 7,534,628 B2
(45) Date of Patent: May 19, 2009

(54) METHOD FOR FORMING SEMICONDUCTOR DEVICE AND METHOD FOR FORMING PHOTOVOLTAIC DEVICE

(75) Inventors: Yasuyoshi Takai, Kawasaki (JP); Tadashi Sawayama, Machida (JP); Koichiro Moriyama, Kobe (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 11/871,534

(22) Filed: Oct. 12, 2007

(65) Prior Publication Data
US 2008/0096291 A1 Apr. 24, 2008

(30) Foreign Application Priority Data
Oct. 12, 2006 (JP) ............................... 2006-278918
Aug. 27, 2007 (JP) ............................... 2007-219926

(51) Int. Cl.
H01L 21/00 (2006.01)
H01L 21/324 (2006.01)
C23C 14/00 (2006.01)

(52) U.S. Cl. .................... 438/5; 438/795; 118/723 R

(58) Field of Classification Search ............ 438/5, 438/795, 798; 118/715, 723 E, 723 R
See application file for complete search history.

(56) References Cited

U.S. PATENT DOCUMENTS

| | | | | |
|---|---|---|---|---|
| 5,238,546 A * | 8/1993 | Bergmann et al. | ..... | 204/192.38 |
| 6,043,427 A | 3/2000 | Nishimoto | ................... | 136/258 |
| 6,162,988 A | 12/2000 | Okabe et al. | ................. | 136/258 |
| 6,326,304 B1 | 12/2001 | Yoshimi et al. | ............. | 438/680 |
| 6,337,224 B1 | 1/2002 | Okamoto et al. | .............. | 438/69 |
| 6,399,873 B1 | 6/2002 | Sano et al. | ................... | 136/249 |
| 6,472,248 B2 | 10/2002 | Shiozaki et al. | ............... | 438/97 |
| 6,483,021 B2 | 11/2002 | Saito | .......................... | 136/258 |
| 7,166,853 B2 * | 1/2007 | Rhoads | .................. | 250/492.21 |
| 2006/0252283 A1 | 11/2006 | Takeda et al. | ............... | 438/798 |
| 2007/0284045 A1 * | 12/2007 | Fischer et al. | .......... | 156/345.43 |
| 2008/0075640 A1 | 3/2008 | Takeda et al. | ............... | 422/186 |

FOREIGN PATENT DOCUMENTS

| | | |
|---|---|---|
| EP | 0151754 B1 | 12/1991 |
| JP | 57-159070 | 10/1982 |
| JP | 59-097514 | 6/1984 |

(Continued)

OTHER PUBLICATIONS courtesy copy of Japanese Office Action dated Oct. 28, 2008, for Appln. No. 2007-219926 (4 sheets, in Japanese).

*Primary Examiner*—W. David Coleman
(74) *Attorney, Agent, or Firm*—Fitzpatrick, Cella, Harper & Scinto

(57) ABSTRACT

A method for forming a semiconductor device including a semiconductor layer, formed of a silicon-based deposited film containing crystals by plasma-enhanced CVD, includes the steps of applying a bias voltage between a high-frequency electrode and a substrate with the high-frequency electrode being negative when the semiconductor layer is formed; detecting sparks occurring on the high-frequency electrode or the substrate; and controlling at least one condition, selected from the group consisting of high-frequency power, bias voltage, bias current, pressure, gas flow rate, and interelectrode distance, based on the results of the detection so that the number of sparks with durations of 100 ms or more is 1 or less sparks per minute.

12 Claims, 11 Drawing Sheets

FOREIGN PATENT DOCUMENTS

| | | |
|---|---|---|
| JP | 61-119030 | 6/1986 |
| JP | 63-220578 | 9/1988 |
| JP | 06-085291 | 3/1994 |
| JP | 6-147225 | 5/1994 |
| JP | 7-99776 | 10/1995 |
| JP | 9-266097 A | 10/1999 |
| JP | 11-330520 | 11/1999 |
| JP | 2000-183377 | 6/2000 |
| JP | 2000-243992 | 9/2000 |
| JP | 2002-235175 A | 8/2002 |
| JP | 2002-371358 A | 12/2002 |
| WO | WO 2005/015964 A1 | 2/2005 |

* cited by examiner

METHOD FOR FORMING SEMICONDUCTOR DEVICE AND METHOD FOR FORMING PHOTOVOLTAIC DEVICE

BACKGROUND OF THE INVENTION

1. Field of the Invention

The present invention relates to methods for forming semiconductor devices including deposited films, particularly, silicon-based deposited films, and methods for forming photovoltaic devices, such as solar cells, including silicon-based deposited films.

2. Description of the Related Art

High-frequency plasma-enhanced chemical vapor deposition (CVD) is one superior method for mass production of silicon-based deposited films because this method facilitates formation of large films at low temperature with high process throughput. Examples of applications of such silicon-based deposited films for products include solar cells. In comparison with existing energy generation systems using fossil fuels, solar cells including silicon-based deposited films have the advantage of using an infinite energy source and a clean power generation process. However, a further cost reduction is required to promote widespread use. Accordingly, the development of techniques for increasing the deposition rate in high-frequency plasma-enhanced CVD and achieving a further improvement in characteristics is an important technological issue.

A method for forming a crystalline silicon-based deposited film layer is disclosed in, for example, Japanese Patent Laid-Open No. 11-330520. According to this publication, a deposited film is formed on a substrate in a reaction chamber containing a silane-family gas and hydrogen gas at a pressure of 5 Torr or more, and having an interelectrode distance of 1 cm or less. The publication discloses that a silicon-based film layer can be deposited at high speed under such conditions and that a photoelectric conversion device including the deposited film has high conversion efficiency.

U.S. Pat. No. 6,326,304 discloses a technique for forming an amorphous silicon-based deposited film under the following conditions. That is, the deposited film is formed at a silane-family gas partial pressure of 1.2 to 5.0 Torr and an interelectrode distance of 8 to 15 mm using a hydrogen diluent gas in an amount of not more than four times that of the silane-family gas.

U.S. Pat. No. 6,483,021 discloses a stacked photovoltaic device including at least two p-i-n junction devices stacked on top of each other, one including an i-type microcrystalline semiconductor layer and another including an i-type amorphous semiconductor layer. In this stacked photovoltaic device, the p-i-n junction device including the i-type microcrystalline semiconductor layer determines current to suppress optical degradation of the photovoltaic device and improve its characteristics.

Other plasma-enhanced CVD techniques have been proposed in which the conditions where an i-type deposited film is formed are appropriately controlled to improve the characteristics of semiconductor devices including photoelectric conversion elements.

Japanese Patent Laid-Open No. 63-220578, for example, discloses a photovoltaic device including a photoelectric conversion element including first and second deposited films that are substantially intrinsic. The first deposited film is thinner than the second deposited film. The first deposited film is formed at a higher pressure than the second deposited film to improve the open-circuit voltage characteristics and short-circuit current characteristics of the photovoltaic device.

European Patent No. 0151754 (B1) discloses a technique for controlling the conditions where an amorphous intrinsic semiconductor layer is formed when an amorphous silicon semiconductor device is formed. Specifically, the main part of the amorphous intrinsic semiconductor layer is deposited by microwave plasma discharge before the rest of the semiconductor layer, thinner than the main part, is deposited by RF plasma discharge. This method can improve both the rate at which the deposited film is formed and the characteristics of the semiconductor device.

Japanese Patent Publication No. 7-99776 discloses a method in which a hydrogen-diluted silane gas is used to deposit an i-type layer in contact with a p-type layer and a 100% silane gas is used to deposit a bulk i-type layer. The i-type layer in contact with the p-type layer and the bulk i-type layer can be deposited at different deposition rates to suppress a deterioration in interface properties and to improve characteristics and mass productivity.

Japanese Patent Laid-Open Nos. 6-85291, 2000-183377, and 2000-243992 disclose techniques for changing the deposition rate when an i-type non-single-crystal silicon-based semiconductor layer or an i-type crystalline silicon-based photoelectric conversion layer is formed. A photoelectric conversion layer thus formed provides a high-quality semiconductor device or photoelectric conversion device that can suppress optical degradation and has high efficiency and stability.

Japanese Patent Laid-Open No. 61-119030 and Japanese Patent Publication No. 61-47225 disclose techniques for applying a positive DC bias voltage to a substrate electrode or applying a DC bias to either discharge electrode when an amorphous semiconductor layer is formed. The DC bias can be controlled to increase the deposition rate.

Japanese Patent Laid-Open No. 59-97514 discloses a technique for forming an amorphous silicon film on a substrate while applying a DC voltage to a conductive portion of the substrate to control the optical energy gap.

Japanese Patent Laid-Open No. 57-159070 discloses a technique for forming an i-type amorphous silicon film on the light-incidence side at a lower substrate temperature than on the light-transmission side. Such temperature control allows the hydrogen content and forbidden band width of the amorphous silicon film to be controlled, thereby improving photoelectric conversion efficiency.

The characteristics of silicon-based deposited films formed by plasma-enhanced CVD have gradually been improved by techniques as disclosed in the patent documents described above. For example, a silicon deposited film containing crystals with relatively superior characteristics can be formed at a high deposition rate, namely, 1 nm/s or more, by plasma-enhanced CVD at relatively high pressure (for example, 600 Pa or more) and short interelectrode distance (for example, 10 mm or less). Semiconductor devices produced by the above techniques, including photovoltaic devices such as solar cells, have superior characteristics, for example, increased conversion efficiency and suppressed degradation rate.

However, some problems must be solved to further improve the characteristics of photovoltaic devices including silicon deposited films containing crystals, and to reduce their costs.

Reducing structural defects in a deposited film being formed is important for forming a silicon film containing crystals (hereinafter referred to as a microcrystalline silicon film) with superior characteristics. It is also important to form a deposited film without causing cation damage to the surface of the deposited film being formed.

Techniques of controlling some parameters in a process of forming a deposited film by plasma-enhanced CVD are known, as disclosed in the above patent documents. Specifically, a deposited film with adequate quality can be formed by appropriately controlling, for example, interelectrode distance, pressure, source gas flow rate, diluent gas flow rate, ratio in gas flow rate, frequency of high-frequency power, deposition rate, and bias voltage. However, a further improvement has been desired to suppress formation of structural defects in a microcrystalline silicon film being formed, and to suppress cation damage.

A first problem is (1) induction of sparks that destabilize plasma and (2) increased growth of fine particles of byproducts such as polysilane in the plasma, depending on the conditions where the deposited film is formed. The sparks adversely affect the characteristics of the deposited film because they increase, for example, structural defects in the deposited film.

The term "sparks" used in the present invention refers to a sudden transition from glow discharge to arc discharge (one type of abnormal discharge).

If a spark occurs on the surface of the deposited film, the spark itself damages the surface of the deposited film, thus forming a structural defect. Even if the spark occurs at a site other than the surface of the deposited film, the discharge undergoes momentary interruption at the instant of occurrence of the spark, thus forming a discontinuous interface in the deposited film. Such an interface can adversely affect, for example, the electrical or optical characteristics of the deposited film. In addition, while the spark is occurring, a polymerization reaction of active species is predominant in the deposition chamber because the high-frequency energy does not contribute to decomposition of the source gas. This promotes growth of fine particles of, for example, polysilane.

The findings of the inventors show that such sparks do not occur uniformly, but occur at different sites for different durations. For example, the sparks tend to occur at edges, such as those of a substrate and a high-frequency electrode, and in the peripheries thereof. In the step of forming the deposited film, additionally, the sparks can be induced by changes in the relative positions of the substrate and the high-frequency electrode due to, for example, thermal stress or transfer of the substrate. For example, many sparks tend to occur at a site where the distance between the high-frequency electrode and the substrate (interelectrode distance) is slightly or significantly changed instantaneously.

The sparks also vary in duration (spark duration) according to detailed data. Specifically, the sparks include extremely small sparks with durations of several microseconds or less, sparks with durations of several microseconds to several tens of microseconds, sparks with durations of several tens of microseconds to several tens of milliseconds, sparks with durations of several tens of milliseconds to several hundreds of milliseconds, and sparks with durations of several hundreds of milliseconds or more. Sparks with longer durations have a larger adverse effect on the deposited film.

It has been known that sparks occur in the step of forming a deposited film by plasma-enhanced CVD. However, extremely small sparks (with spark durations of several microseconds to several tens of milliseconds) have not been understood in detail because they are difficult to visually recognize and the discharge remains apparently stable.

A spark killer (a device that detects a change in bias current and reduces or interrupts the voltage being applied upon detection of a predetermined value of current) is known for use as a spark-suppressing device, but sparks are difficult to completely avoid. For example, if the sensitivity of the spark killer is increased, the bias voltage is frequently interrupted due to noise other than sparks. This makes it difficult to perform stable discharge. Accordingly, while spark killers are intended to suppress the frequency of occurrence or magnitude of sparks, they cannot always sufficiently suppress the occurrence of small sparks.

As described above, optimizing the conditions where a deposited film is formed is not easy because the occurrence of sparks and fine particles of, for example, polysilane can be induced.

A second problem is the difficulty of forming a microcrystalline silicon film with an appropriate grain size and few structural defects to increase conversion efficiency.

According to the findings of the inventors, a deposited film containing microcrystalline silicon cannot provide a sufficient open-circuit voltage and has low short-circuit current when used for solar cells if the film has a small crystal grain size or includes numerous defects at its crystal grain boundaries. The deposited film also has the problem of a decrease in film quality over time which leads to, for example, decreased electrical characteristics.

In addition, the content of microcrystals in the deposited film can be decreased, and the amorphous content can be increased correspondingly, depending on the conditions where the deposited film is formed. If such a deposited film is exposed to extended light irradiation, weak bonds included in the molecular network are cleaved and the number of dangling bonds is increased accordingly, depending on the thickness of the deposited film. This adversely affects the characteristics of the deposited film. If such a deposited film is used as an i-type layer of a p-i-n junction photoelectric conversion element in a solar cell, for example, its characteristics can be significantly decreased due to optical degradation, depending on the layer structure of the solar cell.

The characteristics of the deposited film thus depend on the conditions where the film is formed. The findings of the inventors show that it is effective to suppress cation damage to the deposited film.

If the conditions where the deposited film is formed are controlled only in view of cation damage, however, the rate at which the deposited film is formed may be decreased, and the characteristics of the deposited film may be degraded due to factors other than cation damage (for example, a change in the state of plasma). This makes it difficult to form a deposited film containing microcrystals with characteristics that are optimum for photovoltaic devices such as solar cells.

The patent documents described above disclose no technique effective against the first and second problems.

Japanese Patent Laid-Open No. 11-330520 and U.S. Pat. Nos. 6,326,304 and 6,483,021 contain no disclosure as to suppression of cation damage in separate steps for forming an i-type silicon-based deposited film layer or as to suppression of sparks.

Japanese Patent Laid-Open No. 63-220578 discloses the technique for controlling the pressure at which an i-type layer is formed. Because plasma potential generally decreases with increasing pressure, the first substantially intrinsic deposited film, which is thinner than the second substantially intrinsic deposited film, will suffer a smaller cation damage than the second deposited film. This publication, however, contains no sufficient disclosure as to control of cation damage with bias voltage, as to formation of an i-type microcrystalline silicon layer, or as to suppression of sparks.

European Patent No. 0151754 (B1) discloses a technique for controlling the frequency of high-frequency power when an intrinsic amorphous semiconductor layer is formed. This publication, however, contains no sufficient disclosure as to control of cation damage with bias voltage, as to suppression of sparks, or as to microcrystalline silicon.

Japanese Patent Publication No. 7-99776 contains no sufficient disclosure as to control of cation damage with bias voltage, as to suppression of sparks, or as to microcrystalline silicon.

Japanese Patent Laid-Open Nos. 6-85291, 2000-183377, and 2000-243992 contain no disclosure as to control of cation damage with bias voltage or as to suppression of sparks.

Japanese Patent Laid-Open No. 61-119030 and Japanese Patent Publication No. 61-47225 disclose techniques for applying a positive DC bias voltage to a substrate electrode, or applying a DC bias to either discharge electrode, and controlling the DV bias when an amorphous semiconductor layer is formed. These publications, however, contain no disclosure as to control of cation damage to a microcrystalline silicon film with bias voltage or as to suppression of sparks. The application of the DC bias does not directly result in reduced cation damage. In addition, the plasma itself also varies with the polarity of the bias voltage and the type of electrode to which the voltage is applied, and the effect of the bias varies accordingly. For example, the electrical characteristics of an amorphous silicon film can be improved by forcing cations to collide with the deposited film (ion bombardment), unlike a microcrystalline silicon film. This is probably because the ion bombardment locally anneals the deposited film to promote its structural relaxation. On this point, microcrystalline silicon films in the present invention differ significantly from amorphous silicon films in the effect of application of bias voltage.

Japanese Patent Laid-Open Nos. 59-97514 and 57-159070 contain no disclosure as to control of cation damage to a microcrystalline silicon film with bias voltage or as to suppression of sparks.

Furthermore, none of the above patent documents discloses a technique for suppressing sparks (particularly, extremely small sparks) in a step of forming a deposited film.

SUMMARY OF THE INVENTION

The present invention is intended to solve the above problems and to readily optimize the conditions where a microcrystalline silicon film (one type of silicon film containing crystals) is formed. An object of the present invention is to provide a microcrystalline silicon film that has a sufficient crystal grain size and reduced structural defects and can provide a balance at a high level between an improvement in the characteristics of a semiconductor device or the conversion efficiency of a photovoltaic device and suppression of optical degradation.

Another object of the present invention is to reduce manufacturing costs of semiconductor devices, including photovoltaic devices such as solar cells.

The present invention, which has been completed as a result of intensive studies by the inventors to solve the above problems, can be summarized as follows.

The present invention provides a method for forming a semiconductor device including a semiconductor layer formed of a silicon-based deposited film containing crystals by plasma-enhanced CVD. This method includes the steps of applying a bias voltage between a high-frequency electrode and a substrate with the high-frequency electrode being negative when the semiconductor layer is formed; detecting sparks occurring on the high-frequency electrode or the substrate; and controlling at least one condition selected from the group consisting of high-frequency power, bias voltage, bias current, pressure, gas flow rate, and interelectrode distance, based on the results of the detection so that the number of sparks with durations of 100 ms or more is 1 or less sparks per minute.

The method of the present invention can be used to effectively solve the problems described above.

That is, this method can effectively suppress adverse effects resulting from, for example, the formation of structural defects in a surface of the deposited film due to sparks (particularly, extremely small sparks) and the formation and intrusion of fine particles into the deposited film. As a result, a deposited film containing microcrystalline silicon with few structural defects can be formed.

In particular, a deposited film containing microcrystalline silicon and having optimal characteristics can be formed according to the characteristics required.

In addition, this method can effectively suppress cation damage to a microcrystalline silicon deposited film being formed, thus improving the characteristics of the microcrystalline silicon film and providing a balance between an improvement in conversion efficiency and suppression of optical degradation at a high level.

In particular, excellent growth of crystal grains can be promoted if cation damage occurring at a semiconductor junction interface of a microcrystalline silicon film is smaller than that occurring in a bulk region. As a result, a microcrystalline silicon film with few structural defects and an optimal particle size can be formed.

Furthermore, this method provides the outstanding effect of reducing manufacturing costs of photovoltaic devices such as solar cells.

Further features of the present invention will become apparent from the following description of exemplary embodiments with reference to the attached drawings.

DESCRIPTION OF THE EMBODIMENTS

Embodiments of the present invention will now be described in detail with reference to the drawings, although the invention is not limited to these embodiments.

The present invention will now be described in detail with reference to FIGS. 1 to 4.

Figure 1:
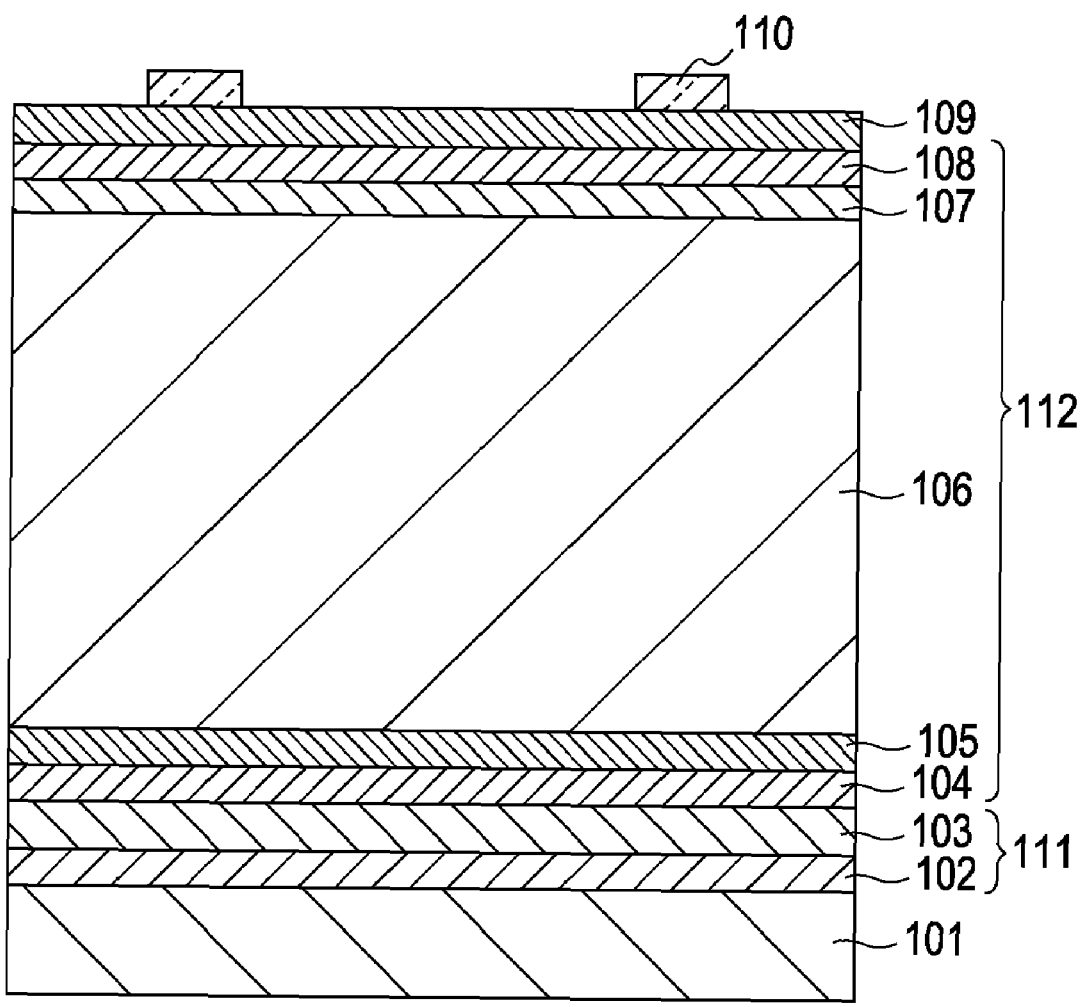
FIG. 1 is a diagram showing a layer structure of a solar cell of the present invention.

FIG. 1 shows an example of a layer structure of a solar cell produced according to the present invention. In FIG. 1, the solar cell includes a substrate 101, a reflective layer 102, a reflection-enhancing layer 103, an n-type or p-type layer 104, an n/i or p/i buffer layer (first i-type layer) 105, an i-type layer (second i-type layer) 106, a p/i or n/i buffer layer (third i-type layer) 107, a p-type or n-type layer 108, a transparent electrode 109, and a collector electrode 110. The reflective layer 102 and the reflection-enhancing layer 103 constitute a back reflective layer 111. The n-type or p-type layer 104, the n/i or p/i buffer layer 105, the i-type layer 106, the p/i or n/i buffer layer 107, and the p-type or n-type layer 108 constitute a first photovoltaic device 112.

The n/i or p/i buffer layer 105, the i-type layer 106, and the p/i or n/i buffer layer 107 are a first i-type layer, a second i-type layer, and a third i-type layer, respectively, in the present invention.

Figure 2:
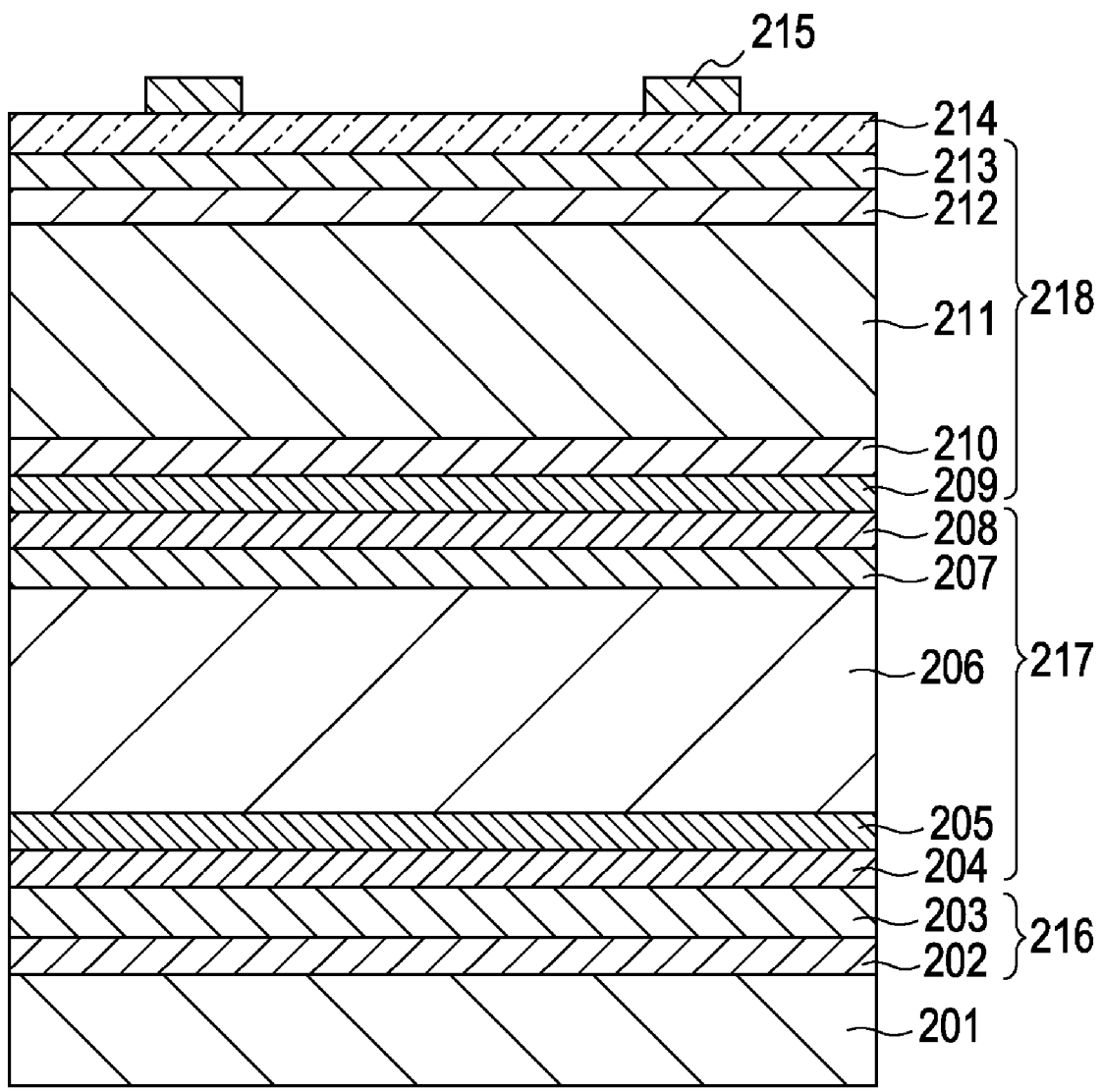
FIG. 2 is a diagram showing another layer structure of a solar cell of the present invention.

FIG. 2 shows another example of a layer structure of a solar cell produced according to the present invention.

In FIG. 2, the solar cell includes a substrate 201, a reflective layer 202, a reflection-enhancing layer 203, an n-type or p-type layer 204, an n/i or p/i buffer layer (first i-type layer) 205, an i-type layer (second i-type layer) 206, a p/i or n/i buffer layer (third i-type layer) 207, a p-type or n-type layer 208, an n-type or p-type layer 209, an n/i or p/i buffer layer (first i-type layer) 210, an i-type layer (second i-type layer) 211, a p/i or n/i buffer layer (third i-type layer) 212, a p-type or n-type layer 213, a transparent electrode 214, and a collector electrode 215. The reflective layer 202 and the reflection-enhancing layer 203 constitute a back reflective layer 216. The n-type or p-type layer 204, the n/i or p/i buffer layer 205, the i-type layer 206, the p/i or n/i buffer layer 207, and the p-type or n-type layer 208 constitute a first photovoltaic device 217. Similarly, a second photovoltaic device 218 is also constituted.

The n/i or p/i buffer layers 205 and 210, the i-type layers 206 and 211, and the p/i or n/i buffer layers 207 and 212 are first i-type layers, second i-type layers, and third i-type layers, respectively, in the present invention.

Figure 3:
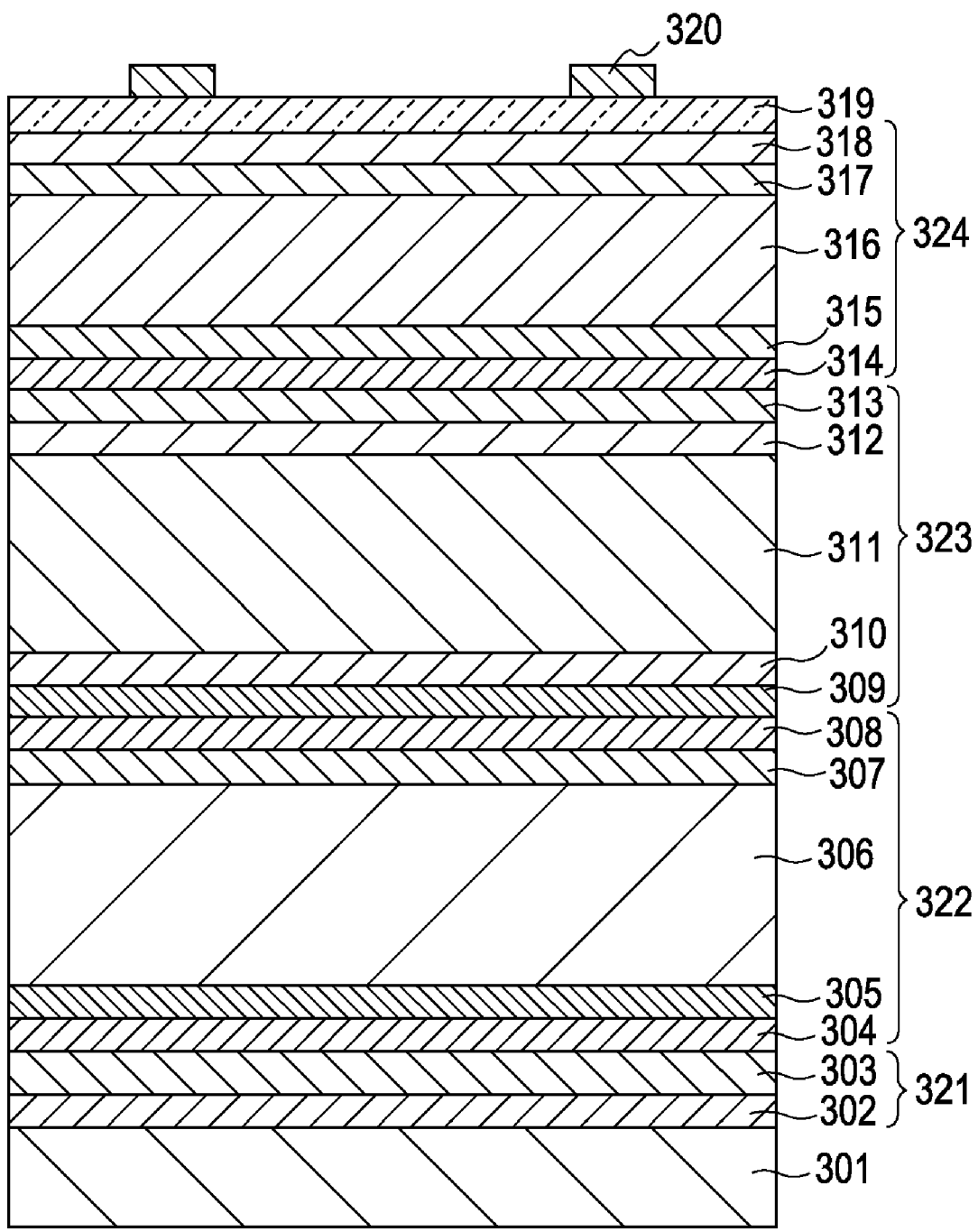
FIG. 3 is a diagram showing another layer structure of a solar cell of the present invention.

FIG. 3 shows another example of a layer structure of a solar cell produced according to the present invention.

In FIG. 3, the solar cell includes a substrate 301, a reflective layer 302, a reflection-enhancing layer 303, an n-type or p-type layer 304, an n/i or p/i buffer layer (first i-type layer) 305, an i-type layer (second i-type layer) 306, a p/i or n/i buffer layer (third i-type layer) 307, a p-type or n-type layer 308, an n-type or p-type layer 309, an n/i or p/i buffer layer (first i-type layer) 310, an i-type layer (second i-type layer) 311, a p/i or n/i buffer layer (third i-type layer) 312, a p-type or n-type layer 313, an n-type or p-type layer 314, an n/i or p/i buffer layer (first i-type layer) 315, an i-type layer (second i-type layer) 316, a p/i or n/i buffer layer (third i-type layer) 317, a p-type or n-type layer 318, a transparent electrode 319, and a collector electrode 320. The reflective layer 302 and the reflection-enhancing layer 303 constitute a back reflective layer 321. A first photovoltaic device 322, a second photovoltaic device 323, and a third photovoltaic device 324 are constituted.

The n/i or p/i buffer layers 305, 310, and 315, the i-type layers 306, 311, and 316, and the p/i or n/i buffer layers 307, 312, and 317 are first i-type layers, second i-type layers, and third i-type layers, respectively, in the present invention.

Figure 4:
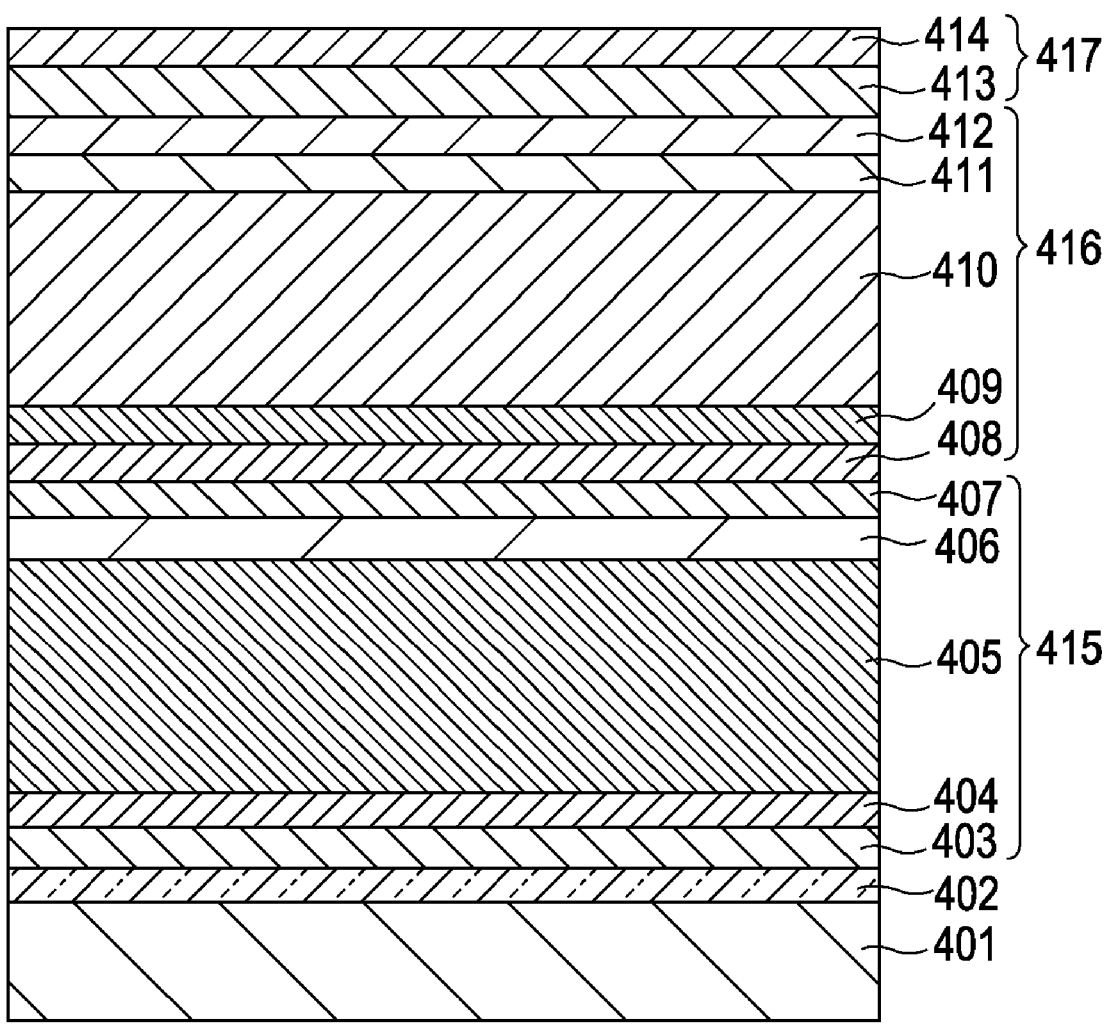
FIG. 4 is a diagram showing another layer structure of a solar cell of the present invention.

FIG. 4 shows another example of a layer structure of a solar cell produced according to the present invention. In FIG. 4, photovoltaic devices are formed on a transparent substrate through which light enters the devices.

In FIG. 4, the solar cell includes a transparent substrate 401, a transparent electrode 402, a p-type or n-type layer 403, a p/i or n/i buffer layer (first i-type layer) 404, an i-type layer (second i-type layer) 405, an n/i or p/i buffer layer (third i-type layer) 406, an n-type or p-type layer 407, a p-type or n-type layer 408, a p/i or n/i buffer layer (first i-type layer) 409, an i-type layer (second i-type layer) 410, an n/i or p/i buffer layer (third i-type layer) 411, an n-type or p-type layer 412, a reflection-enhancing layer 413, and a back electrode 414. A first photovoltaic device 415 and a second photovoltaic device 416 are constituted. The reflection-enhancing layer 413 and the back electrode 414 constitute a back reflective layer 417.

The p/i or n/i buffer layers 404 and 409, the i-type layers 405 and 410, and the n/i or p/i buffer layers 406 and 411 are first i-type layers, second i-type layers, and third i-type layers, respectively, in the present invention.

A semiconductor layer of the present invention containing microcrystalline silicon (p/i and n/i buffer layers and i-type layers in FIGS. 1 to 4) is formed by applying a bias voltage between a high-frequency electrode and a substrate with the high-frequency electrode being negative. This suppresses cation damage to a surface of a deposited film. In addition, the conditions where the semiconductor layer is formed are controlled so that the number of sparks with durations of 100 ms or more is 1 or less sparks per minute. This allows for generation of a uniform, stable plasma, so that a uniform deposited film can be formed while suppressing formation of fine particles in the plasma space (discharge space).

If the i-type layer of the present invention containing microcrystalline silicon is formed by two or more steps, at least one of the first and third i-type layers is formed of an i-type layer of the present invention containing microcrystalline silicon. This suppresses cation damage to a deposited film forming a semiconductor-junction interface and promotes growth of crystal grains, thus providing a photovoltaic device that has few structural defects and shows no or only a slight decrease in characteristics after extended light irradiation.

Applications of the i-type layer of the present invention are not limited to photovoltaic devices and include other devices such as thin-film transistors (TFTs) and sensors.

A method of the present invention for forming a semiconductor device or a photovoltaic device can be applied to any of batch film-deposition apparatuses, single-wafer film-deposition apparatuses, and roll-to-roll film-deposition apparatuses.

Although the mechanism of the present invention has not been fully elucidated at present, the inventors assume the mechanism to be as follows.

To elucidate the details of the spark phenomenon, the inventors measured discharge power waveforms, from the occurrence of sparks, to recovery with a spark detector (which measures bias current and determines that a spark has occurred when detecting a predetermined current or more) connected to a matching box coupling a high-frequency power supply and a high-frequency electrode, using signals upon detection of sparks as triggers. In the present invention, the spark detector used can be any device capable of measuring variations in current or voltage in extremely short periods of time (microseconds to milliseconds). For example, an oscilloscope can be used.

Figure 7A:
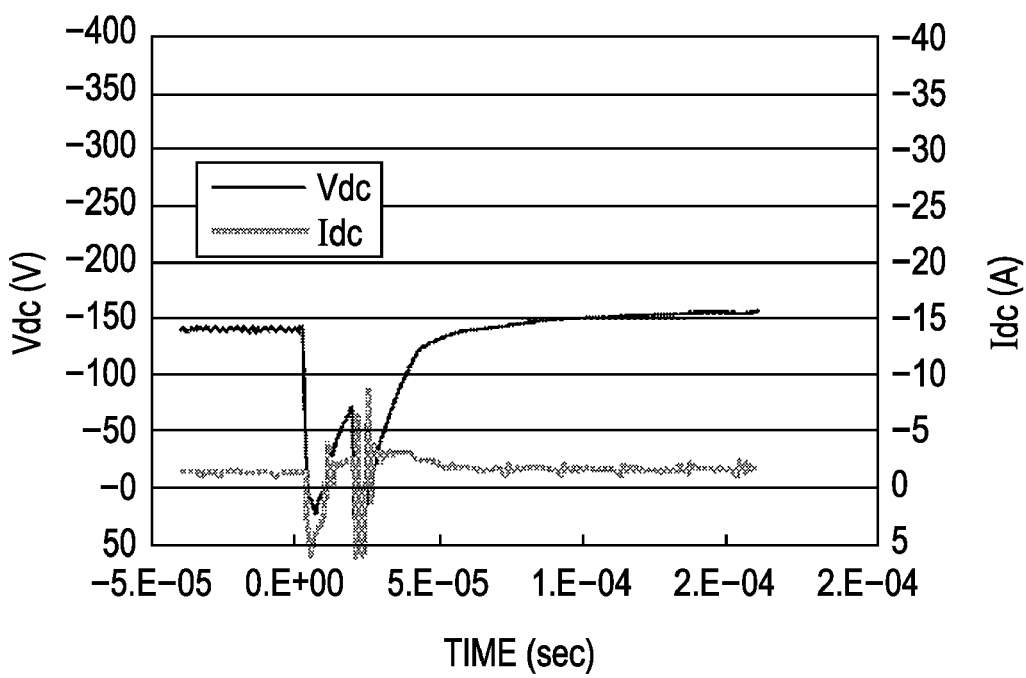
FIGS. 7A and 7B are graphs showing variations in current and voltage upon the occurrence of sparks.
Figure 7B:
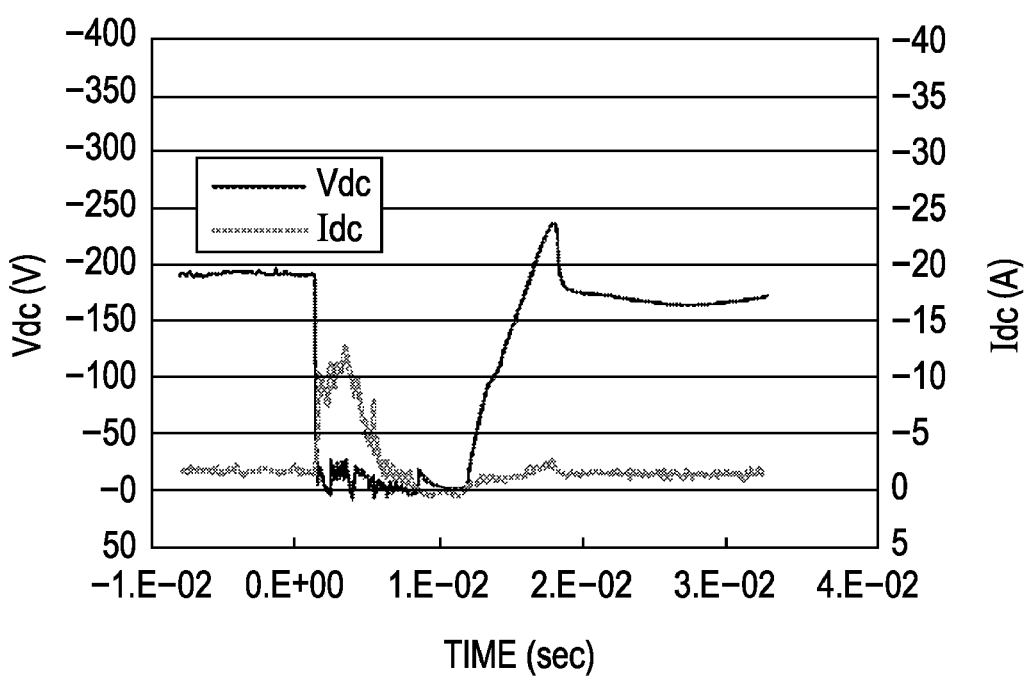

FIGS. 7A and 7B are graphs showing variations in current and voltage upon the occurrence of sparks. In each graph, the horizontal axis indicates time and the vertical axis indicates bias current and bias voltage.

The measurement shown in FIG. 7A is performed at an interelectrode distance of 10 mm, a $SiH_4$ gas flow rate of 500 sccm, a $SiF_4$ gas flow rate of 400 sccm, a $H_2$ gas flow rate of 12 slm, a VHF power of 5 kW, a DC voltage of 0 to −125 V, a DC current of 0 to 2.5 A, and a pressure of 1,300 Pa.

The measurement shown in FIG. 7B is performed at an interelectrode distance of 7 mm, a $SiH_4$ gas flow rate of 500 sccm, a $SiF_4$ gas flow rate of 400 sccm, a $H_2$ gas flow rate of 12 slm, a VHF power of 5 kW, a DC voltage of 0 to −125 V, a DC current of 0 to 2.5 A, and a pressure of 1,300 Pa.

FIG. 7A shows the state of a spark at −150 V after the bias voltage (DC voltage) applied to the high-frequency electrode is gradually increased. According to the operating time of the spark detector, it took about 20 μs from detection of the spark until a steady state is recovered after the DC voltage being applied is reduced to zero and a negative potential is applied again. In the present invention, spark duration is defined as the time from occurrence of a spark (when a bias voltage is reduced to zero) until the bias voltage is recovered. Hence, FIG. 7A shows that an extremely small spark with a spark duration of about 20 μs occurred in the deposition chamber. Such an extremely small spark cannot be visually recognized.

In FIG. 7B, the duration of a spark is measured at a reduced interelectrode distance (10 mm in FIG. 7A to 7 mm in FIG. 7B) and an increased DC voltage applied to the high-frequency electrode. In this case, the spark duration is measured to be 10 ms at a bias voltage of −200 V. Thus, the magnitude of a spark depends on the deposition conditions.

According to the findings of the inventors, sparks with durations of about several microseconds to several tens of milliseconds have a low probability of causing critical damage to a deposited film, depending on the number of sparks. In contrast, sparks with durations of more than several tens of milliseconds to several hundreds of milliseconds have a significant adverse effect on the characteristics of the deposited film. Furthermore, sparks with durations of several hundreds of milliseconds or more can damage, for example, the substrate, the electrode, or the inner walls of the deposition chamber, depending on the sites where the sparks occur. In particular, if a roll-to-roll system is employed with an elongated strip-like substrate, the sparks can melt and fracture the substrate, which can no longer be transferred.

According to the findings of the inventors, additionally, the occurrence of sparks also affects formation of fine particles of, for example, polysilane, as described above.

Polysilane seems to be formed in the deposition chamber (discharge space) mainly by the following reaction. That is, polysilane is formed through a polymerization reaction of active species resulting from decomposition of silane gas by high-frequency energy with undecomposed source gases (typically, $SiH_4$ and $SiF_4$) or other active species (mainly, polymerization reaction between $SiH_4$ and $SiH_2$).

The size of the polysilane particles in the discharge space depends on discharge conditions and apparatus configuration. According to the findings of the inventors, the polysilane forms relatively small polymer clusters (probably about 10 to 100 nm in size) in the steady state (where the discharge is stable). The mechanism by which such a polymer is formed is assumed to be as follows. In the discharge space, an equilibrium is established between the polymerization reaction of polysilane and the decomposition reaction in which part of the polymer being formed is decomposed again by the high-frequency power. The probability of the polymerization reaction is decreased because the reaction does not proceed in one direction and the amount of species to be subjected to polymerization in the discharge space is decreased as the reaction proceeds. In addition, relatively small polymer clusters are formed probably because the polymerization reaction is limited by the retention time of the active species in the discharge space.

If the discharge is stably maintained in the discharge space under predetermined conditions, as described above, a large amount of polysilane is not deposited on the inner walls of the reaction chamber, the high-frequency electrode, or the substrate, in comparison with the outside of the discharge space. Even if relatively small polysilane particles (clusters) are formed, they are not directly deposited in powder form on the inner walls of the reaction chamber and the surface of the substrate, which define the discharge space. Most of the polysilane will be negatively charged in the discharge space and experience, for example, electrostatic force, ion drag, gas viscous force, thermophoresis, gravity, and diffusion force. The polysilane will be confined within the discharge space (probably near a sheath) under the action of such forces and will be discharged from the discharge space together with the gas flow.

If a spark instantaneously interrupts the discharge, a formation of polysilane is observed at a site where the spark has occurred on the surface of the substrate. When the discharge is interrupted, the polysilane confined within the discharge space is released from the electrical force while the decomposition reaction is inhibited because the energy supplied from the discharge is interrupted. As a result, the polymerization reaction of the $SiH_2$ present upon occurrence of the spark with the surrounding $SiH_4$ becomes predominant, and thus the polymerization reaction and agglomeration reaction proceed.

Accordingly, the occurrence of sparks increases the probability of incorporation of polysilane formed in the discharge space into the deposited film. Even for extremely small sparks, a high frequency of occurrence results in increased probability of incorporation of polysilane into the deposited film.

Furthermore, the occurrence of sparks itself can adversely affect the deposited film. A spark occurring on the deposited film causes a large instantaneous current to flow through a minute region on the deposited film. Such a current can break part of the deposited film and cause a structural defect.

Cation damage caused during the formation of the deposited film can be thought of as follows.

When a microcrystalline silicon film is formed, an electric field (self-bias), induced by generation of plasma, forces cations resulting from decomposition of source gases in the plasma to collide with the deposited film (ion bombardment). This bombardment damages the deposited film (ion damage) by disturbing the structure of its molecular network.

The deposited film thus formed has increased structural defects which degrade, for example, the electrical characteristics of the film.

If the bias voltage is applied with the cathode (high-frequency electrode) being negative, some of the cations are electrically restrained on the cathode side. This lowers the probability of bombardment of the deposited film on the substrate, thus reducing the amount of ion damage incurred.

Figure 8:
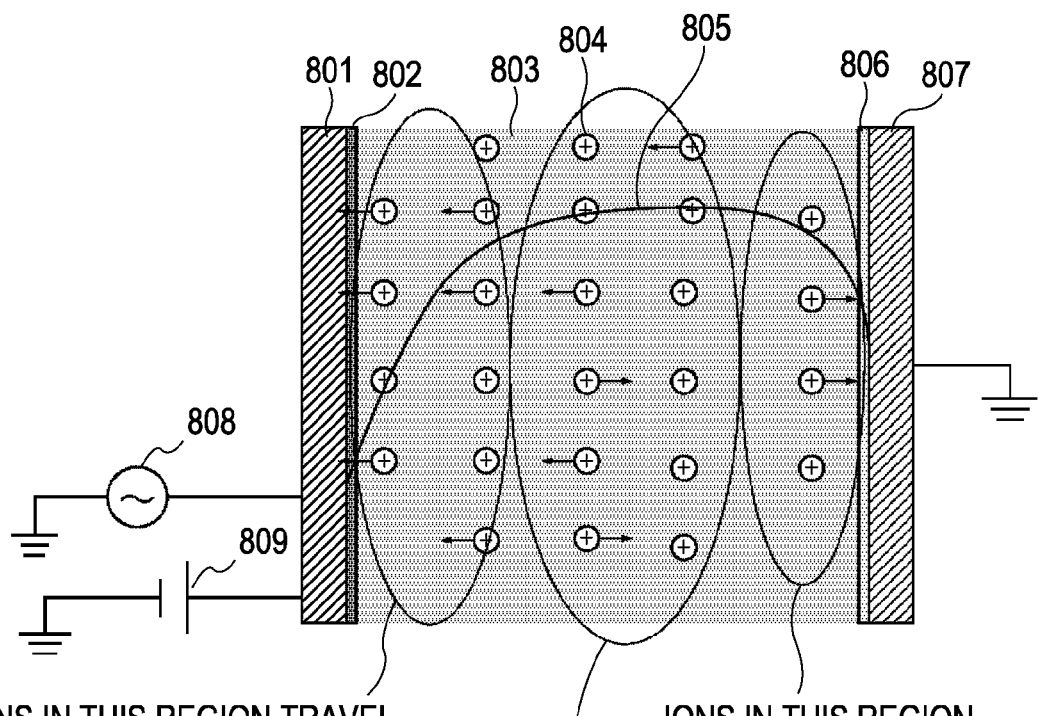
FIG. 8 is a diagram illustrating the effect of suppressing ion damage to a microcrystalline film by applying a bias voltage.

This mechanism will be described with reference to FIG. 8. FIG. 8 is a diagram illustrating the effect of suppressing ion damage to a microcrystalline film by applying a bias voltage.

FIG. 8 shows a high-frequency electrode 801, a film 802 deposited on the high-frequency electrode 801, a discharge space 803, cations 804, an electric field 805 in the discharge space 803, a microcrystalline silicon film 806, a substrate 807 on which the silicon film 806 is deposited, a high-frequency power supply 808, and a DC bias power supply 809.

Some of the cations 804 in the plasma can be attracted (restrained) to the cathode (high-frequency electrode 801) side by applying a negative bias voltage to the cathode.

The bias voltage thus reduces the number of cations 804 attacking the substrate 807 side, so that the structure of the film 806 deposited on the substrate 807 is less disturbed and microcrystals are formed (ion-damage suppressing effect). A high bias voltage applied to suppress ion damage, however, has the detrimental effect of increasing the frequency of occurrence of sparks and the amount of polysilane formed.

The findings of the inventors show that both the spark duration and the frequency of occurrence of sparks increase with increasing bias voltage (the bias current is also increased), as described above. According to the findings, specifically, the probability of occurrence of large sparks with spark durations of several tens of milliseconds or more is increased.

To examine the correlation between the bias voltage applied and the amount of polysilane formed, the inventors observed the interior of an adjacent exhaust pipe communicating with a film-deposition chamber (plasma space) using a scattered laser light measurement.

Figure 9:
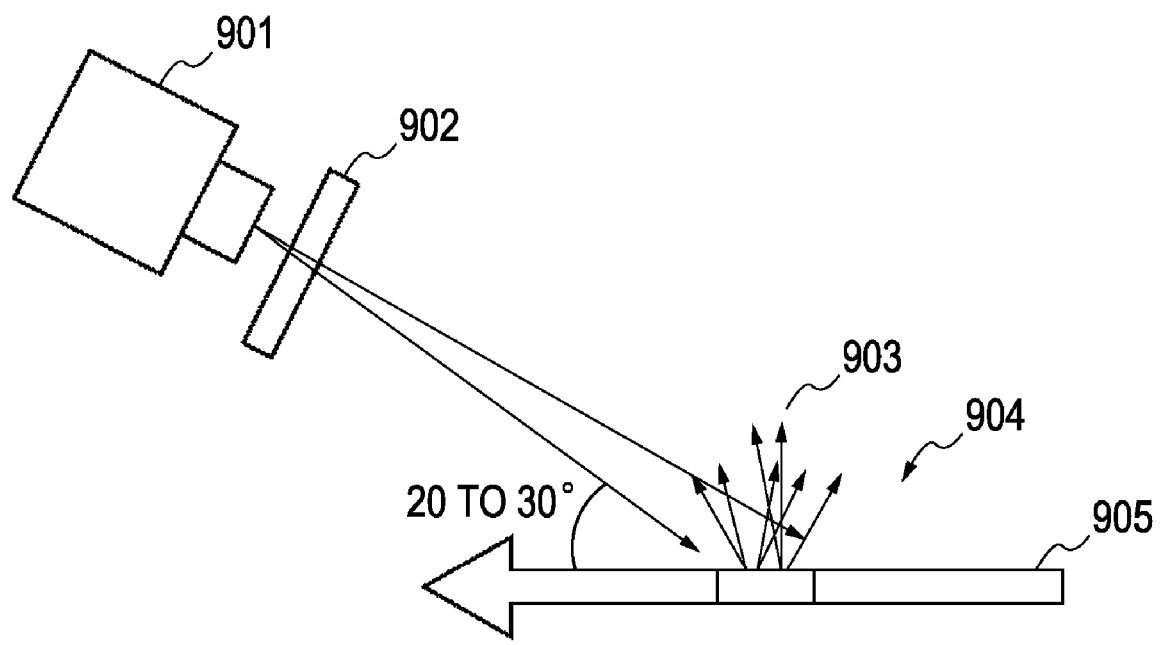
FIG. 9 is a diagram showing a measurement system used to examine the formation of polysilane.

FIG. 9 shows a measurement system used to examine formation of polysilane in exhaust gas. FIG. 9 shows a CCD camera 901, a bandpass filter 902, an exhaust gas 903 containing polysilane, scattered light 904, and laser light 905.

The results of the measurement demonstrate that the intensity of scattered laser light (the amount of polysilane formed) increased exponentially with increasing DC bias voltage and correspondingly increasing bias current. These results are shown in FIG. 10.

Figure 10:
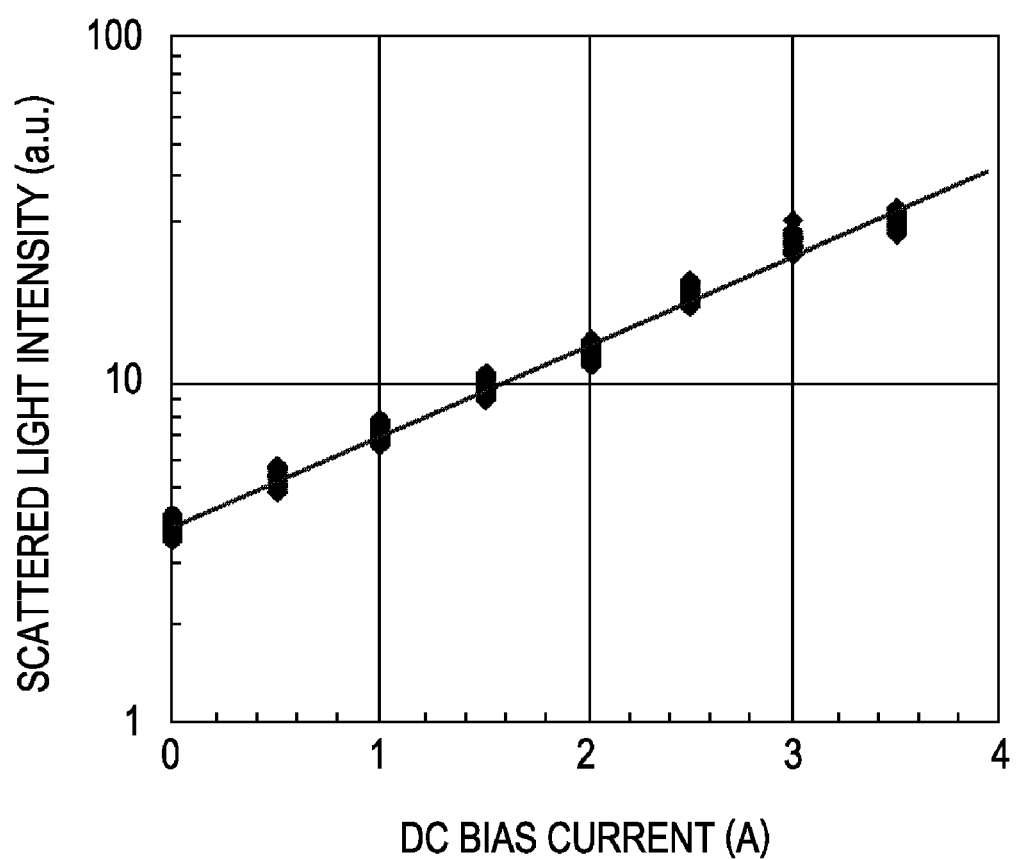
FIG. 10 is a graph showing variations in the intensity of scattered laser light (i.e., the amount of polysilane formed) with increasing DC bias voltage and correspondingly increasing bias current.

In FIG. 10, the horizontal axis indicates the DC bias current and the vertical axis indicates the intensity of scattered laser light. FIG. 10 shows that the bias voltage applied to suppress cation damage has a side effect of promoting formation of polysilane.

As the bias current (bias voltage) is increased, a larger amount of ion species in the plasma space is restrained (moved to the cathode side), as described above. This will change the concentration distributions of $SiH_2$, a neutral active species, and $SiH_4$, a source gas, in the gas phase (increase their concentrations at sites remote from the electrode), thus increasing the probability of collision and promoting the polymerization reaction.

In parallel with or independent of the above reaction, the increased bias current may also promote the polymerization reaction by promoting the decomposition reaction of the source gases to increase the concentration of $SiH_2$.

Accordingly, it is important to achieve a balance between suppression of sparks and reduction of cation damage at a high level.

Focusing on extremely small sparks, which have not been studied in detail, the present invention provides a method for forming a microcrystalline silicon film under such conditions that few extremely small sparks occur, and the advantages of the present invention can thus be achieved.

When a microcrystalline film is formed at a semiconductor junction interface, the bias voltage or current is not uniformly applied, but is controlled under such conditions as to give priority to reduction of cation damage. When a bulk layer is formed, the advantages of the present invention can be enhanced by controlling the bias voltage or current so as to give priority to suppression of extremely small sparks.

When the interface is formed, the probability of the occurrence of sparks is slightly increased if the bias voltage or bias current is increased to suppress cation damage. However, this causes no problem if the bias voltage or bias current is controlled so as not to cause a plurality of sparks during the formation of the same layer, specifically, if the number of sparks with durations of 100 ms or more is 1 or less sparks per minute.

According to the findings of the inventors, sparks are induced mainly in the following cases:

(1) the high-frequency power supplied exceeds a withstand voltage at which sparks occur relative to pressure, interelectrode distance, the combination of gas species, and flow rate;

(2) the interelectrode distance cannot be constantly maintained due to deformation of the substrate; and (3) the high-frequency power is not uniformly distributed in the plane of the electrode but is locally concentrated.

In the present invention, therefore, controlling deposition conditions selected from high-frequency power, bias voltage, bias current, pressure, gas flow rate, and interelectrode distance, is important to effectively suppress the occurrence of extremely small sparks.

While the occurrence and duration of sparks vary with the bias voltage applied, the balance between the high-frequency power supplied and pressure, interelectrode distance, the combination of gas species, and flow rate is important. Sparks occur at a high frequency of occurrence if the above combination exceeds the withstand voltage of the system of interest at which sparks occur. According to the studies of the inventors, for example, the following tendency is found when $SiH_4$ gas is used as a source gas and $H_2$ gas is used as a diluent gas. That is, a higher high-frequency power, a shorter interelectrode distance, a lower pressure, and a higher diluent gas flow rate tend to result in a higher rate of occurrence of sparks and a longer spark duration.

In the present invention, when a semiconductor device including a semiconductor layer formed of a silicon-based deposited film containing crystals is formed by plasma-enhanced CVD, a bias voltage is applied between a high-frequency electrode and a substrate with the high-frequency electrode being negative (step of applying a bias voltage). Subsequently, occurrence of sparks is monitored, as described above. If sparks are detected (spark-detecting step), at least one condition selected from the group consisting of high-frequency power, bias voltage, bias current, pressure, gas flow rate, and interelectrode distance is controlled so that the spark duration falls within the scope of the present invention (controlling step). The controlling step, as described above, is performed by changing the balance between the high-frequency power supplied and pressure, interelectrode distance, the combination of gas species, and flow rate so as to reduce the possibility of occurrence of sparks.

The relationships between the high-frequency power supplied, pressure, interelectrode distance, the combination of gas species, flow rate, and the rate of occurrence or duration of sparks (state of occurrence of sparks) are determined in advance by, for example, a preliminary experiment or simulation. These relationships can be stored as a data table in, for example, a computer. Alternatively, a manual can be prepared for management by an operator. Thus, the high-frequency power, the pressure, the interelectrode distance, the combination of gas species, and the flow rate, can be controlled so as to suppress the occurrence of sparks immediately after they are detected. For example, in the relationship where the occurrence of sparks is suppressed by reducing the high-frequency power, the high-frequency power is reduced within such a range as to ensure the spark-suppressing effect upon detection of sparks with long durations (for example, 100 ms or more).

In addition, a plurality of parameters selected from high-frequency power, bias voltage, bias current, pressure, gas flow rate, and interelectrode distance, can be controlled so as to suppress the occurrence of sparks. If a plurality of parameters are selected and controlled so as to suppress the occurrence of sparks, each parameter can be controlled stepwise. If all parameters selected are simultaneously changed (controlled), the plasma can become unstable.

Examples of methods for controlling the individual parameters include the following control methods. The high-frequency power can be controlled by increasing or decreasing the power. The pressure can be controlled by increasing or decreasing the gas flow rate (source gas or diluent gas) or by increasing or decreasing exhaust resistance (for example, by opening or closing a valve or increasing or decreasing the number of revolutions of a vacuum pump). The interelectrode distance can typically be controlled by being increased or decreased using a mechanism capable of changing the position of the substrate or the high-frequency electrode when a deposited film is formed. The combination of gas species and the flow rate can be controlled by increasing or decreasing the gas flow rate or introducing a new gas using a known gas-introducing unit, such as a mixing panel, and a mass flow controller with a flow control valve.

If the plasma remains stable for a predetermined period of time after sparks are detected and the occurrence of sparks is suppressed by controlling any of the parameters, the parameter can optionally be restored to (or changed so as to approach) the value before the control to improve the characteristics of the deposited film. This is because the control of the parameters for suppressing the occurrence of sparks in the present invention can be disadvantageous in terms of the characteristics and deposition rate of the deposited film. If the occurrence of sparks is due to a temporary factor (for example, due to noise), restoring the deposition conditions can be more advantageous in terms of the characteristics of the deposited film and the deposition time. This can be correctly determined by storing correlation data such as the state of occurrence of sparks and the characteristics of the deposited film in the step of forming the deposited film in advance.

Some systems provide excellent reproducibility of the occurrence of sparks, depending on the conditions where the deposited film is formed and the time therefor. For such systems, the occurrence of sparks can be suppressed without real-time detection of sparks by determining the time elapsed and the state of occurrence of sparks in the step of forming the deposited film in advance by a preliminary experiment, for example, and controlling high-frequency power, bias voltage, bias current, pressure, gas flow rate, and interelectrode distance, continuously or stepwise over time, in the step of forming the deposited film.

The occurrence of sparks depends not only on the above operating conditions where the deposited film is formed, but also on physical conditions varying during the formation of the deposited film. For example, the rate of occurrence of sparks is increased if the interelectrode distance varies with deformation of the substrate or electrode due to thermal stress or the internal stress of the deposited film during the formation of the deposited film, specifically, if the interelectrode distance is locally decreased with deformation of an end of the substrate. In a system, such as a roll-to-roll system, in which a deposited film is formed with a substrate being transferred, particularly, the rate of occurrence of sparks is increased with deformation or vibration of the substrate because a moving part is incorporated in the deposition chamber.

Accordingly, the relationship between the target characteristics of the deposited film and the state of occurrence of sparks must be examined by measurement or calculation (including simulation) in advance to control the above parameters so that the rate of occurrence and the duration of sparks fall within the scope of the present invention. The individual parameters can be controlled by the same methods as described above.

If deposited films are successively formed, attention must also be paid to possible time-related variations in the rate of occurrence and duration of sparks.

According to the findings of the inventors, sparks tend to occur at a higher rate of occurrence and have longer durations in the state where nearly no film is deposited on the high-frequency electrode immediately after the start of formation of a deposited film. This is probably because a current flows readily due to variations in the temperature of the high-frequency electrode and the absence of any resistor on the surface of the high-frequency electrode immediately after the start of formation of the deposited film.

In this case, the rate of occurrence and duration of sparks can be controlled by maintaining the high-frequency power at a low level until a deposited film is formed to a certain thickness on the high-frequency electrode and the temperature becomes stable. The rate of occurrence and the duration of sparks can also be controlled by, for example, maintaining the bias voltage or the diluent gas flow rate at a low level.

The effect of the bias voltage varies if an extended period of time (for example, 20 hours or more) is allowed for forming the deposited film and the film deposited on the surface of the high-frequency electrode becomes thick (for example, 1 mm or more). Specifically, the bias current decreases gradually at constant bias voltage if an extended period of time is allowed for forming the deposited film. This is probably because the film deposited on the high-frequency electrode functions like a resistor and the interelectrode distance (distance between the substrate and the high-frequency electrode) is decreased by the thickness of the film deposited on the high-frequency electrode. In this case, the bias current is recovered to some extent by increasing the bias voltage, although it also increases the rate of occurrence of sparks.

While the increased voltage itself contributes to a higher rate of occurrence of sparks, other possible causes include unevenness in the resistance of the film deposited on the high-frequency electrode in a plane due to variations in thickness. Another possible cause is that the current is locally promoted by nonuniform film characteristics due to, for example, partial peeling or structural defects on the surface of the film deposited on the high-frequency electrode.

In terms of such time-related variations, the film deposited on the high-frequency electrode must be removed by regular maintenance even if the plasma is apparently stable. In addition, as described above, the balance between the high-frequency power supplied, pressure, interelectrode distance, the combination of gas species, and flow rate, must be controlled.

In this case, as described above, the state of occurrence of sparks during the time allowed for forming the deposited film must be examined by measurement or calculation (including simulation) in advance to control the parameters so that the rate of occurrence and duration of sparks fall within the scope of the present invention on the whole. The individual parameters can be controlled by the same methods as described above.

For example, the occurrence of sparks can be effectively suppressed by examining the correlation between the time allowed for forming the deposited film and variations in bias voltage or bias current in advance, and controlling the time allowed for forming the deposited film based on the correlation.

An acceptable state of occurrence of extremely small sparks in the present invention is a state where the number of sparks with durations of 100 ms or more is 1 or less sparks per minute; or preferably a state where the number of sparks with durations of 100 ms or more is substantially 0 sparks and the number of sparks with durations of 20 to 100 ms is 3 or less sparks per minute; or more preferably a state where the number of sparks with durations of 100 ms or more is substantially 0 sparks and the number of sparks with durations of 50 μs to 20 ms is 5 or less sparks per minute; or most preferably a state where the number of sparks with durations of 100 ms or more is substantially 0 sparks and the number of sparks with durations of 20 to 50 μs is 10 or less sparks per minute. The phrase "the number of sparks with durations of 100 ms or more is substantially 0 sparks" herein not only means occurrence of no spark, but also means that the occurrence of accidental sparks having substantially no effect on productivity is acceptable. This phrase is based on the fact that it is unlikely that the number of sparks with durations of 100 ms or more is 0 sparks in any situation in a plasma-enhanced CVD process. The present invention is intended to control high-frequency power, bias voltage, bias current, pressure, gas flow rate, or interelectrode distance in a system where sparks can occur. It is essential to control the duration and rate of occurrence (number) of sparks within the scope of the present invention. Accordingly, the scope of the present invention does not encompass systems in which no sparks occur at the start of deposition or after extended deposition irrespective of whether or not the deposition conditions described above are controlled.

The polarity of the bias voltage is important in the present invention, and must be applied in such a direction as to reduce cation damage. Specifically, the bias voltage can be applied with the high-frequency electrode being negative.

The DC bias current can be applied so that an effective voltage during the formation of the deposited film (while plasma is being generated) is measured or calculated to be 10 to 1,000 V, particularly 20 to 900 V, more particularly 30 to 800 V, depending on the conditions where the deposited film is formed.

In the present invention, the effective voltage refers to the sum of the peak-to-peak potential difference ($V_{p-p}$) of the high-frequency voltage and the DC bias voltage.

The bias current acceptable in the present invention can be 0.2 to 5 mA/cm$^2$, particularly 0.3 to 4.5 mA/cm$^2$, more particularly 0.5 to 4.0 mA/cm$^2$, per unit area of a high-frequency electrode.

In the present invention, the pressure at which an i-type deposited film containing microcrystals is formed is not particularly limited. To further reduce cation damage and structural defects, the pressure can be controlled within 1,000 to 2,000 Pa, particularly 1,050 to 1,800 Pa, or more particularly 1,100 to 1,500 Pa.

In the present invention, the interelectrode distance refers to the distance between a high-frequency electrode and a counter electrode, and a substrate can be used as the counter electrode. In the present invention, the interelectrode distance is not particularly limited as long as stable discharge is maintained and the necessary rate at which the deposited film is formed is ensured. To further reduce cation damage and increase the rate at which the deposited film is formed, the interelectrode distance can be controlled within 2 to 10 mm, particularly 3 to 9 mm, and more particularly 5 to 8 mm.

In the present invention, the power supplied to a chamber to deposit a microcrystalline semiconductor can be, for example, 0.01 to 10 W/cm$^2$. In terms of the relationship between the flow rates of source gases and the power supplied, a power-limited region, where the deposition rate depends on the power supplied, is appropriate if priority is given to the characteristics of the deposited film, and a flow-limited region, where the deposition rate depends on the flow rates of the gases introduced, is appropriate if priority is given to gas utilization efficiency.

In the present invention, a microcrystalline silicon film (silicon-based film containing crystals) refers to a non-single-crystal silicon deposited film that contains substantially crystalline silicon and can also partially contain amorphous silicon. Specifically, a microcrystalline silicon film refers to a deposited film that meets the condition that the ratio of the Raman scattering intensity resulting from the crystal content of the deposited film to that resulting from the amorphous content exceeds 1. Any silicon film, such as a microcrystalline silicon film or a polysilicon film, that meets the above condition can be regarded as a silicon-based film containing crystals (microcrystalline silicon film) of the present invention.

In the present invention, a silicon-based deposited film refers to a deposited film containing at least 50 atomic percent of silicon. Examples of silicon-based deposited films include Si:H, Si:HX, SiC:H, SiC:HX, SiGe:H, SiGeC:H, SiO:H, SiN:H, SiON:HX, and SiOCN:HX deposited films, specifically, μc-Si:H, μc-SiC:H, μc-Si:HX, μc-SiC:HX, μc-SiGe:H, μc-SiO:H, μc-SiGeC:H, μc-SiN:H, μc-SiON:HX, μc-SiOCN:HX, poly-Si:H, poly-Si:HX, poly-SiC:H, poly-SiC:HX, poly-SiGe:H, poly-Si, poly-SiC, and poly-SiGe deposited films. Such deposited films can be doped with a p-type valence electron control agent (element of Group III of the periodic table, such as boron, aluminum, gallium, indium, or thallium) or with an n-type valence electron control agent (element of Group V of the periodic table, such as phosphorus, arsenic, antimony, or bismuth).

In terms of Raman spectroscopy, a microcrystalline silicon film of the present invention can have a Raman scattering intensity resulting from the crystal content of the deposited film (typically, around 520 cm$^{-1}$) which can be at least three times that resulting from the amorphous content (typically, around 480 cm$^{-1}$).

The average crystal grain size appropriate for a microcrystalline semiconductor of a stacked photovoltaic device of the present invention can be, for example, 10 to 500 nm. In addition, an i-type layer formed of the microcrystalline semiconductor can have a columnar crystal structure.

In the present invention, the structure of a photovoltaic device is not limited to a single structure as shown in FIG. 1. The number of constituent layers can optionally be increased or decreased so as to constitute, for example, a double structure as shown in FIG. 2 or a triple structure as shown in FIG. 3. In addition, the order of layers can be changed according to the type of substrate. For example, a transparent substrate can be used to constitute a structure in which light enters the photovoltaic device through the substrate, as shown in FIG. 4.

Figure 5:
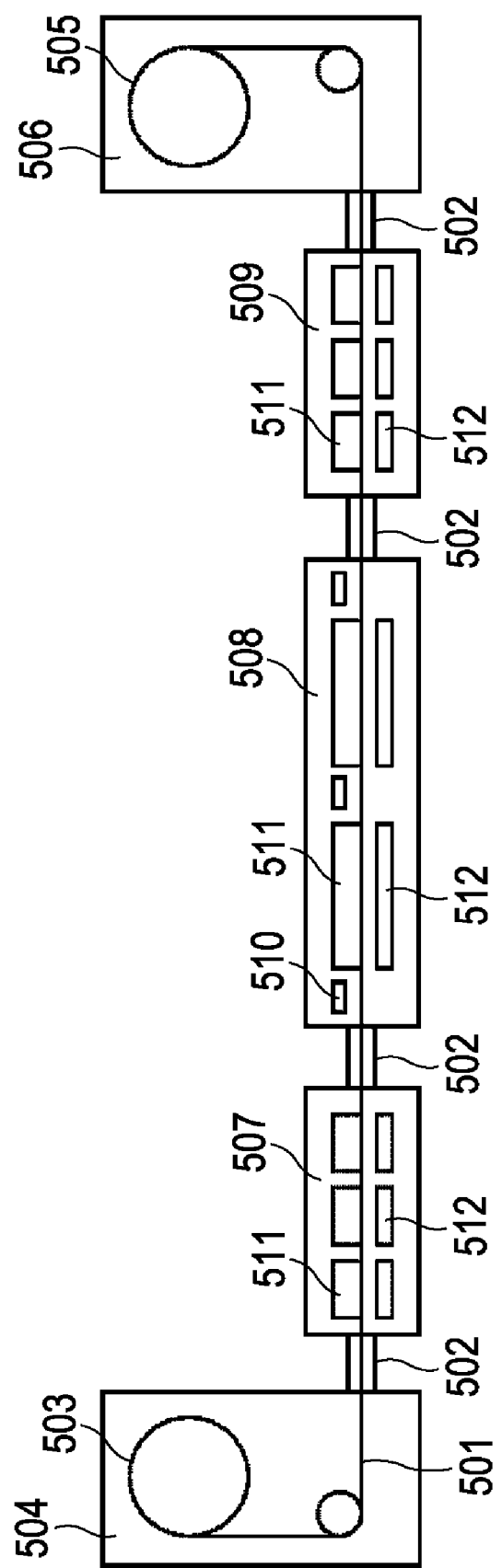
FIG. 5 is a diagram of a production apparatus according to an embodiment of the present invention.

FIG. 5 is a diagram of a production apparatus according to an embodiment of the present invention. In FIG. 5, the apparatus includes gas gates 502, an unwinding bobbin 503, an unwinding chamber 504, a winding bobbin 505, a winding chamber 506, an n-type layer deposition chamber 507, an i-type layer deposition chamber 508, a p-type layer deposition chamber 509, preheaters 510, temperature control units 511, and cathodes (high-frequency electrodes) 512.

Figure 6:
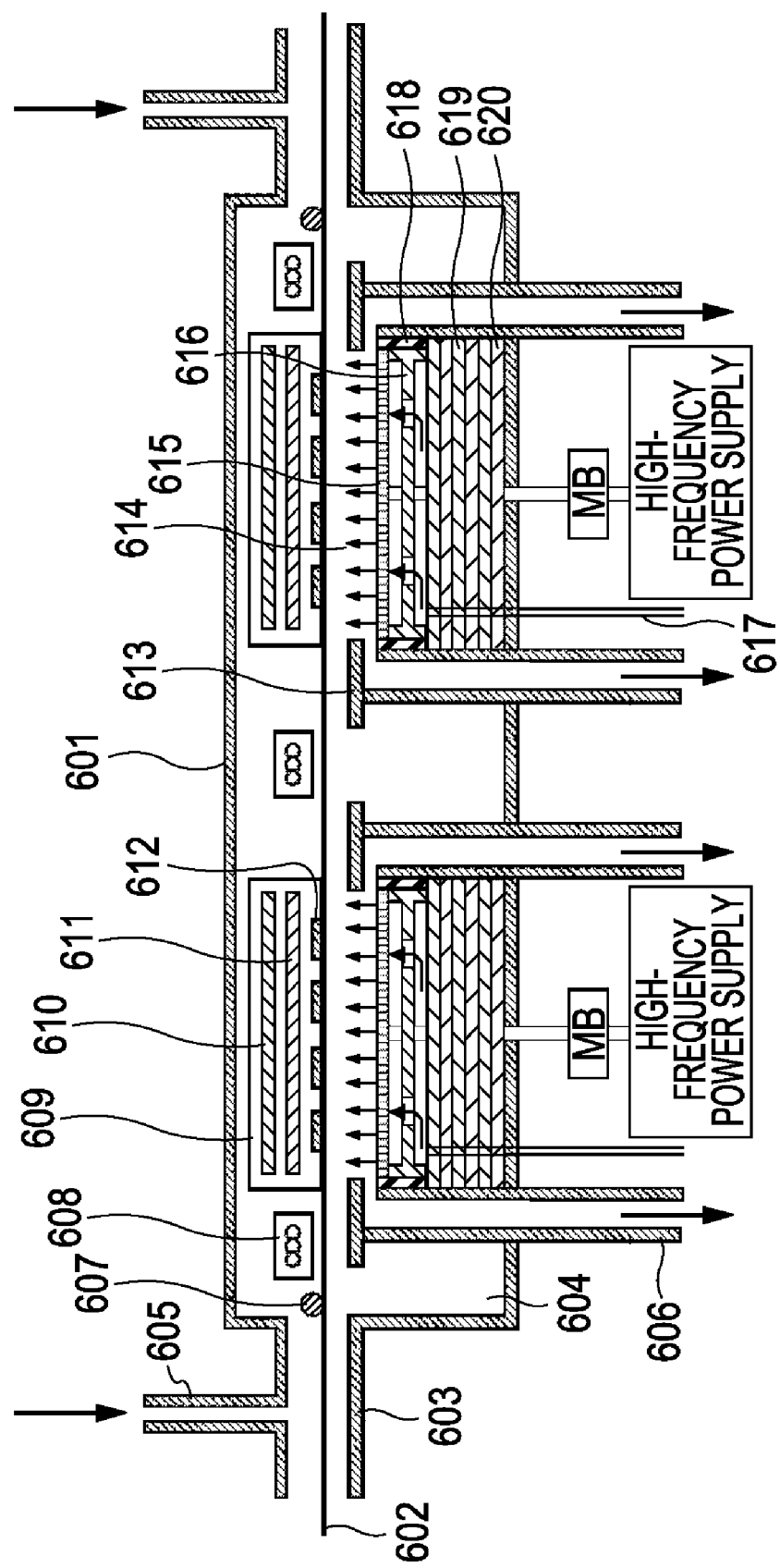
FIG. 6 is an enlarged view of an i-type layer deposition chamber.

FIG. 6 is an enlarged view of an i-type layer deposition chamber. In FIG. 6, an i-type layer deposition chamber 601 includes gas gates 603, a first vacuum vessel 604, gate gas introduction pipes 605, exhaust ports 606, magnet rollers 607, lump heaters 608, temperature control units 609, cooling units 610, heating units 611, magnets 612, opening adjustment plates 613, second vacuum vessels (discharge spaces) 614, shower cathodes 615, intermediate plates 616, source gas introduction pipes 617, insulators 618, floating plates 619, and dielectric plates 620.

A method of the present invention for forming a deposited film will now be described with reference to FIGS. 5 and 6. FIGS. 5 and 6 show a roll-to-roll film-deposition apparatus, although the present invention is not limited to roll-to-roll film-deposition apparatuses and is also effective for batch film-deposition apparatuses and single-wafer film-deposition apparatuses.

In the present invention, the units "sccm" and "slm" are used for the flow rates of gases such as a source gas and a diluent gas. The units "sccm" and "slm" mean "1 cm$^3$/min (normal)" and "1,000 cm$^3$/min (normal)", respectively.

In FIG. 5, a stainless steel substrate 501 has a reflective layer and a reflection-enhancing layer formed using an apparatus for forming the reflective layer and the reflection-enhancing layer (not shown). The substrate 501 is passed from the unwinding bobbin 503 in the unwinding chamber 504 through the gas gate 502. The substrate 501 is then passed through the n-type layer deposition chamber 507, the i-type layer deposition chamber 508, and the p-type layer deposition chamber 509 and is attached to the winding bobbin 505 in the winding chamber 506. Subsequently, the unwinding chamber 504, the winding chamber 506, and the individual deposition chambers 507 to 509 are evacuated through exhaust ports (not shown) to a pressure of, for example, 1×10$^{-4}$ Pa or less. A gate gas (for example, hydrogen or helium) is supplied through the gas gates 502 while desired source gases are supplied at desired flow rates into the respective deposition chambers 507 to 509 through gas introduction pipes (not shown) provided in the deposition chambers 507 to 509. At the same time, the preheaters 510 and the temperature control units 511 in the individual deposition chambers 507 to 509 are used to heat the substrate 501 to a desired temperature. After the source gas flow rate, the substrate temperature, and the pressure, for example, reach predetermined conditions in the individual deposition chambers 507 to 509, a high-frequency power is applied from high-frequency power supplies (not shown) to the cathodes 512 to generate plasma. The substrate 501 is then conveyed from the unwinding chamber 504 side to the winding chamber 506 side to sequentially deposit an n-type layer, an i-type layer, and a p-type layer on the substrate 501, thus forming a p-i-n structure.

Subsequently, a transparent electrode is deposited to a desired thickness on the p-type layer using a vapor deposition apparatus (not shown). Similarly, a collector electrode is deposited on the transparent electrode.

The deposition in the individual deposition chambers 507 to 509 will now be described in more detail with reference to FIG. 6 using the i-type layer deposition chamber 601 as an example. The i-type layer deposition chamber 601 communicates with the gas gates 603 on both sides thereof. The gas gates 502 are provided with the gate gas introduction pipes 605, through which a gate gas such as hydrogen, helium, or another inert gas is introduced. The gate gas functions to avoid mixing of gases from other adjacent deposition chambers. The interior of the i-type layer deposition chamber 601 has a double structure including the first vacuum vessel 604 and the second vacuum vessels 614, which are disposed inside the first vacuum vessel 604 and where high-frequency plasma is generated. The shower cathodes 615, which function as both high-frequency electrodes and gas introduction pipes, are disposed inside the second vacuum vessels 614. High-frequency power supplies are connected to the shower cathodes 615 via matching boxes. The spaces inside the second vacuum vessels 614 are partially separated from the space inside the first vacuum vessel 604 by partition walls. Of the wall surfaces defining the second vacuum vessels 614, the wall surfaces opposite a substrate 602 are defined by the opening adjustment plates 613 so that regions where the plasma generated in the second vacuum vessels 614 come in contact with the substrate 602 can be adjusted.

The substrate 602 in the i-type layer deposition chamber 601 is supported by the magnet rollers 607 and the temperature control units 609 provided in the i-type layer deposition chamber 601. The temperature control units 609 incorporate the cooling units 610 and the heating units 611. The magnets 612 are disposed on surfaces of the temperature control units 609 in contact with the substrate 602 so that the substrate 602 comes in thermal and electrical contact with the temperature control units 609. This structure is used to perform temperature control and potential control (controlled to a ground potential) of the substrate 602 being supported. The shower cathodes 615 have many gas-releasing holes for distributed introduction of gas onto the surface of the substrate 602. The intermediate plates 616 are disposed inside the shower cathodes 615. The intermediate plates 616 have gas channels for uniform gas dispersion to disperse source gases introduced through the gas introduction pipes 617. The source gases then pass through the gas-releasing holes defined in the surface of the shower cathodes 615 to enter the second vacuum vessels (discharge spaces) 614. The floating plates 619 and the dielectric plates 620 are formed of metal and are stacked on top of each other between the shower cathodes 615 and the outer wall of the i-type layer deposition chamber 508. This multi-layer structure allows impedance control of the shower cathodes 615 and suppression of abnormal discharge in the spaces between the shower cathodes 615 and the i-type layer deposition chamber 601 and also efficiently transfers the high-frequency power to the shower cathodes 615. Side surfaces of the shower cathodes 615 are shielded by the insulators 618 and conductive wall surfaces surrounding the insulators 618. The gases introduced into the i-type layer deposition chamber 601 through the shower cathodes 615 and the gas gates 502 are discharged from the exhaust ports 606.

The structure described above includes one n-type layer deposition chamber 507, one i-type layer deposition chamber 508, and one p-type layer deposition chamber 509, although the numbers of deposition chambers can optionally be increased or decreased. For example, such an apparatus configuration can be employed so as to form a stacked photovoltaic device including a desired number of devices stacked, for example, having a double structure or a triple structure. In addition, an n/i or p/i buffer layer deposition chamber can optionally be used in combination with the above deposition chambers 507 to 509.

Next, the individual components of a photovoltaic device of the present invention will be described in detail.

Substrate and Reflection Layer

Substrates suitable for the photovoltaic device of the present invention include metal substrates such as stainless steel substrates, particularly, ferritic stainless steel substrates. Suitable insulating substrates include glass substrates and ceramic substrates.

If an insulating substrate is used, a conductive finish must be applied to a surface of the substrate by depositing, for example, a metal film or a transparent conductive film. If the photovoltaic device is formed using a transparent substrate, such as a glass substrate, on which a transparent conductive film is deposited, light can be allowed to enter the photovoltaic device through both the semiconductor side and the transparent substrate side.

An example of the conductive finish is a reflective layer formed by depositing an elemental metal such as aluminum, silver, or copper or an alloy thereof. The reflective layer must be deposited to at least such a thickness as to provide the reflectance of the metal itself.

The reflective layer can be deposited to a thickness of several tens of nanometers to 300 nm at relatively low temperature to make its surface as flat as possible. The reflective layer can also be deposited to a thickness of more than 300 nm to several micrometers to form an irregular surface.

Reflection-Enhancing Layer

A reflection-enhancing layer can be provided on the substrate or the reflective layer to increase the quantity of light absorbed in a semiconductor layer. The thickness of the reflection-enhancing layer can be, for example, 100 to 5,000 nm.

The reflection-enhancing layer functions to facilitate diffusion of incident light and reflected light, thereby extending the optical path length in the semiconductor layer. The reflection-enhancing layer also functions to prevent shunting of the photovoltaic device due to diffusion or migration of elements constituting the reflective layer into the semiconductor layer. Furthermore, the reflection-enhancing layer functions to prevent a short-circuit due to defects such as pinholes in the semiconductor layer because the reflection-enhancing layer has moderate resistance. Like the reflective layer, the reflection-enhancing layer can have an irregular surface. The reflection-enhancing layer can be formed of a conductive oxide such as indium oxide, tin oxide, zinc oxide, or indium tin oxide (ITO). The reflection-enhancing layer can be formed by, for example, vapor deposition, sputtering, or electrodeposition. These methods can also be used in combination. A material that changes conductivity can be added to the conductive oxide. When the reflection-enhancing layer is formed, a region of the reflection-enhancing layer adjacent to the reflective layer can be formed at a reduced rate. Alternatively, oxygen can be contained in the atmosphere where the region of the reflection-enhancing layer adjacent to the reflective layer is formed.

Formation of the reflective layer and the reflection-enhancing layer by sputtering depends largely on conditions such as the type of sputtering, the type and flow rate of gas, internal pressure, power supplied, deposition rate, and substrate temperature. If a zinc oxide film is formed using a zinc oxide target by DC magnetron sputtering, for example, the gas species used can be, for example, argon, neon, krypton, xenon, mercury, or oxygen. The flow rate of the gas varies with the size of apparatus and exhaust speed. For example, the flow rate can be 1 to 100 sccm for a deposition space with a volume of 20 L. The internal pressure during the deposition can be 10 mPa to 10 Pa. The power supplied, depending on the size of target, can be 10 W to 10 kW for a target with a diameter of 15 cm. The substrate temperature, depending on the deposition rate, can be 70° C. to 450° C. for a deposition rate of 1 µm/h.

If a zinc oxide film is formed by electrodeposition, a corrosion-resistant container containing an aqueous solution containing nitrate ions and zinc ions can be used. The concentrations of the nitrate ions and the zinc ions can be 0.001 to 1.0 mol/L, particularly 0.01 to 0.5 mol/L, more particularly 0.1 to 0.25 mol/L. The sources of the nitrate ions and the zinc ions are not particularly limited, and zinc nitrate can be used as a source of both ions. Alternatively, a mixture of a water-soluble nitrate salt such as ammonium nitrate, serving as a source of nitrate ions, and a zinc salt such as zinc sulfate, serving as a source of zinc ions, can be used. A carbohydrate can be added to the aqueous solution to inhibit abnormal growth and enhance adhesion. The type of carbohydrate used is not particularly limited, and examples thereof include monosaccharides such as glucose and fructose, disaccharides such as maltose and saccharose, polysaccharides such as dextrin and starch, and mixtures thereof.

For example, phthalic acid, isophthalic acid, maleic acid, naphthalic acid, or an ester thereof can optionally be added to control, for example, the crystal grain size and angle of inclination of the zinc oxide film. The concentration of such a polycarboxylic acid can be 0.5 to 500 µmol/L, particularly 50 to 500 µmol/L, more particularly 150 to 500 µmol/L. The concentration of the polycarboxylic acid can thus be controlled to efficiently form a zinc oxide film having a textured structure suitable for the effect of trapping light.

The amount of carbohydrate added to the aqueous solution, depending on the type of carbohydrate, can generally be 0.001 to 300 g/L, particularly 0.005 to 100 g/L, more particularly 0.01 to 60 g/L. If a zinc oxide film is deposited by electrodeposition, a base on which the zinc oxide film is to be deposited can be used as a cathode in combination with, for example, a zinc, platinum, or carbon anode in the aqueous solution. In this case, the density of current flowing through a load resistor can be 10 mA/dm to 10 A/dm.

P-Type Layer and N-Type Layer

A p-type layer and an n-type layer are important layers that affect the characteristics of the photovoltaic device. Examples of amorphous materials, microcrystalline materials, or polycrystalline materials used for the p-type layer and the n-type layer include a-Si:H, a-Si:HX, a-SiC:H, a-SiC:HX, a-SiGe:H, a-SiGeC:H, a-SiO:H, a-SiN:H, a-SiON:HX, a-SiOCN:HX, µc-Si:H, µc-SiC:H, µc-Si:HX, µc-SiC:HX, µc-SiGe:H, µc-SiO:H, µc-SiGeC:H, µc-SiN:H, µc-SiON:HX, µc-SiOCN:HX, poly-Si:H, poly-Si:HX, poly-SiC:H, poly-SiC:HX, poly-SiGe:H, poly-Si, poly-SiC, poly-SiGe, and materials prepared by highly doping the above materials with a p-type valence electron control agent (element of Group III of the periodic table, such as boron, aluminum, gallium, indium, or thallium) or with an n-type valence electron control agent (element of Group V of the periodic table, such as phosphorus, arsenic, antimony, or bismuth).

In particular, a crystalline semiconductor layer that absorbs less light or an amorphous semiconductor layer with a wide band gap is suitable for the p-type or n-type layer on the light-incidence side.

The amount of Group III element added to the p-type layer and the amount of Group V element added to the n-type layer can be, for example, 0.1 to 50 atomic percent.

The hydrogen (H or D) or halogen atoms contained in the p-type and n-type layers function to compensate for dangling bonds of the p-type and n-type layers, thus improving their doping efficiency. The amount of hydrogen or halogen atoms added to the p-type and n-type layers can be, for example, 0.1 to 40 atomic percent. In particular, if the p-type and n-type layers are crystalline, the amount of hydrogen or halogen atoms added to the p-type and n-type layers can be, for example, 0.1 to 8 atomic percent.

Such a distribution pattern can be formed that the content of hydrogen and/or halogen atoms is higher at interfaces between the p-type and n-type layers and an i-type layer. The content of hydrogen and/or halogen atoms near the interfaces can be, for example, 1.1 to 2 times that in a bulk region of the i-type layer. The content of hydrogen and/or halogen atoms can thus be increased near the interfaces between the p-type and n-type layers and the i-type layer to reduce defect levels and mechanical strain near the interfaces. This contributes to an increase in the photoelectromotive force and photoelectric current of a stacked photovoltaic device of the present invention.

For electrical characteristics, the p-type and n-type layers of the photovoltaic device can have an activation energy of 0.2 eV or less, particularly 0.1 eV or less, and a resistivity of 100 Ωcm or less, particularly 1 Ωcm or less. In addition, the p-type and n-type layers can have a thickness of 1 to 50 nm, particularly 3 to 10 nm.

Examples of source gases suitable for deposition of the p-type and n-type layers of the photovoltaic device include gasifiable compounds containing silicon atoms, gasifiable compounds containing germanium atoms, gasifiable compounds containing carbon atoms, and gaseous mixtures thereof.

Examples of gasifiable compounds containing silicon atoms include $SiH_4$, $Si_2H_6$, $SiF_4$, $SiFH_3$, $SiF_2H_2$, $SiF_3H$, $Si_3H_8$, $SiD_4$, $SiHD_3$, $SiH_2D_2$, $SiH_3D$, $SiFD_3$, $SiF_2D_2$, $SiD_3H$, and $Si_2D_3H_3$.

Examples of gasifiable compounds containing germanium atoms include $GeH_4$, $GeD_4$, $GeF_4$, $GeFH_3$, $GeF_2H_2$, $GeF_3H$, $GeHD_3$, $GeH_2D_2$, $GeH_3D$, $Ge_2H_6$, and $Ge_2D_6$.

Examples of gasifiable compounds containing carbon atoms include $CH_4$, $CD_4$, $C_nH_{2n+2}$ (n is an integer), $C_nH_{2n}$ (n is an integer), $C_2H_2$, $C_6H_6$, $CO_2$, and CO.

Examples of nitrogen-containing gases include $N_2$, $NH_3$, $ND_3$, NO, $NO_2$, and $N_2O$.

Examples of oxygen-containing gases include $O_2$, CO, $CO_2$, NO, $NO_2$, $N_2O$, $CH_3CH_2OH$, and $CH_3OH$.

Examples of materials introduced to the p-type and n-type layers for valence electron control include the elements of Groups III and V of the periodic table.

Examples of materials that can be effectively used as a starting material for introduction of a Group III element include those for introduction of boron atoms, including boron hydrides such as $B_2H_6$, $B_4H_{10}$, $B_5H_9$, $B_5H_{11}$, $B_6H_{10}$, $B_6H_{12}$, and $B_6H_{14}$ and boron halides such as $BF_3$ and $BCl_3$. Other examples include $AlCl_3$, $GaCl_3$, $InCl_3$, and $TlCl_3$. In particular, $B_2H_6$ and $BF_3$ are suitable.

Examples of materials that can be effectively used as a starting material for introduction of a Group V element include those for introduction of phosphorus atoms, including phosphorus hydrides such as $PH_3$ and $P_2H_4$ and phosphorus halides such as $PH_4I$, $PF_3$, $PF_5$, $PCl_3$, $PCl_5$, $PBr_3$, $PBr_5$, and $PI_3$. Other examples include $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, and $BiBr_3$. In particular, $PH_3$ and $PF_3$ are suitable.

Examples of methods suitable for deposition of the p-type and n-type layers of the photovoltaic device include RF plasma-enhanced CVD, VHF plasma-enhanced CVD, and microwave plasma-enhanced CVD. In particular, capacitively-coupled plasma-enhanced CVD is suitable for deposition by RF plasma-enhanced CVD or VHF plasma-enhanced CVD. If the p-type and n-type layers are deposited by RF plasma-enhanced CVD or VHF plasma-enhanced CVD, they can be deposited in the deposition chamber at, for example, a substrate temperature of 100° C. to 350° C., an internal pressure of 10 to 2,000 Pa, an RF or VHF power of 0.01 to 5.0 W/cm$^2$, and a deposition rate of 0.1 to 10 nm/s.

The above gasifiable compounds can optionally be diluted with a gas such as hydrogen, helium, neon, argon, xenon, or krypton before introduction into the deposition chamber.

In particular, if a layer that absorbs less light or has a wide band gap, such as a microcrystalline semiconductor layer or an a-SiC:H layer, is deposited, the source gas can be diluted 2 to 100 times with hydrogen gas, and a relatively high RF or VHF power can be introduced. In the present invention, the RF used can be 1 to 30 MHz, particularly around 13.56 MHz. The VHF used can be 30 to 500 MHz, particularly 40 to 450 MHz, more particularly 50 to 400 MHz.

If the p-type and n-type layers are deposited by microwave plasma-enhanced CVD, introduction of microwaves into a deposition chamber of a microwave plasma-enhanced CVD apparatus through a dielectric window (for example, an alumina ceramic window) using a waveguide is suitable. Although the method of the present invention for forming a deposited film is also suitable for deposition of the p-type and n-type layers by microwave plasma-enhanced CVD, deposited films applicable to the photovoltaic device can be formed over a wider range of deposition conditions.

If the p-type and n-type layers are deposited by microwave plasma-enhanced CVD, they can be deposited in the deposition chamber at, for example, a substrate temperature of 100° C. to 400° C., an internal pressure of 0.05 to 300 Pa, a microwave power of 0.01 to 1 W/cm$^2$, and a microwave frequency of 0.5 to 10 GHz.

The above gasifiable compounds can optionally be diluted with a gas such as hydrogen, helium, neon, argon, xenon, or krypton before introduction into the deposition chamber.

If a layer that absorbs less light or has a wide band gap, such as a microcrystalline semiconductor layer or an a-SiC:H layer, is deposited, the source gas can be diluted 2 to 100 times with hydrogen gas, and a relatively high microwave power can be introduced.

I-Type Microcrystalline Layer

Examples of methods suitable for deposition of an i-type layer containing microcrystalline silicon in the photovoltaic device of the present invention include RF plasma-enhanced CVD, VHF plasma-enhanced CVD, and microwave plasma-enhanced CVD. In particular, the deposition rate of microcrystalline silicon depends on the type of electromagnetic wave used; the deposition rate is higher at a higher frequency for the same amount of energy supplied.

Examples of source gases suitable for supplying silicon atoms to deposit microcrystalline silicon in the present invention include silane-family source gases such as $SiH_4$, $Si_2H_6$, $SiF_4$, $SiHF_3$, $SiH_2F_2$, $SiH_3F$, $SiH_3Cl$, $SiH_2Cl_2$, $SiHCl_3$, $SiCl_4$, $SiD_4$, $SiHD_3$, $SiH_2D_2$, $SiH_3D$, $SiFD_3$, $SiF_2D_2$, $SiD_3H$, and $Si_2D_3H_3$.

Examples of source gases suitable for supplying germanium atoms to deposit microcrystalline silicon germanium include $GeH_4$, $GeF_4$, $GeHF_3$, $GeH_2F_2$, $GeH_3F$, $GeHCl_3$, $GeH_2Cl_2$, $GeH_3Cl$, $GeHD_3$, $GeH_2D_2$, $GeH_3D$, $Ge_2H_6$, and $Ge_2D_6$.

Such source gases must be diluted with hydrogen gas to form an excellent microcrystalline semiconductor. The dilution ratio can be 10 times or more, particularly 10 to 100 times. If the dilution ratio is low, no microcrystals are formed, but an amorphous layer is formed. An excessive dilution ratio, however, causes the practical problem of an excessively low rate at which microcrystals are deposited. The source gases can be diluted with helium gas in addition to hydrogen gas.

The substrate temperature at which microcrystals appropriate for the present invention can be formed is 100° C. to 500° C. To increase the deposition rate, particularly, the substrate temperature can be controlled to a relatively high temperature.

The microcrystalline semiconductor of the stacked photovoltaic device of the present invention can have an average crystal grain size of, for example, 10 to 500 nm. In terms of Raman spectroscopy, the amorphous content of the microcrystalline semiconductor can be controlled so that the ratio of the Raman scattering intensity resulting from the crystal content of the deposited film to that resulting from the amorphous content is three times or more.

If the average crystal grain size falls below 10 nm, optical degradation occurs due to a high amorphous content at the crystal grain boundaries. If the average crystal grain size is small, additionally, the semiconductor exhibits degraded characteristics, including decreased electron and hole mobility and decreased life span. If the average crystal grain size exceeds 500 nm, defects such as dangling bonds occur because the crystal grain boundaries are not sufficiently relaxed. Such defects act as recombination centers for electrons and holes, thus decreasing the characteristics of the microcrystalline semiconductor.

Microcrystals having a shape elongated in a direction in which carriers travel are suitable. In addition, the content of hydrogen or halogen atoms in the microcrystals in the present invention can be 30% or less.

In the photovoltaic device, the i-type layer is an important layer for generating and transporting carriers upon irradiation with light. The i-type layer used can be slightly p-type or n-type (which depends on the distribution of inherent defects such as tail states).

Semiconductors suitable for the i-type layer of the photovoltaic device of the present invention include semiconductors whose band gap is uniform; semiconductors which contain silicon atoms and germanium atoms and whose band gap varies smoothly in the thickness direction thereof, specifically, semiconductors whose band gap is minimized at a position shifted from the center of the i-type layer toward the interface between the p-type layer and the i-type layer; and semiconductors doped with both a valence electron control agent serving as a donor and a valence electron control agent serving as an acceptor.

In particular, such a distribution pattern can be formed that the content of hydrogen and/or halogen atoms is higher at the interfaces between the p-type and n-type layers and the i-type layer. The content of hydrogen and/or halogen atoms near the interfaces can be, for example, 1.1 to 2 times that in the bulk region of the i-type layer. In addition, it is possible that the content of hydrogen and/or halogen atoms varies with that of silicon atoms. The content of hydrogen and/or halogen atoms in a region where the content of silicon atoms is minimized can be 1 to 10 atomic percent and can be 0.3 to 0.8 times that in a region where the content of hydrogen and/or halogen atoms is maximized.

In this case, the content of hydrogen and/or halogen atoms varies with that of silicon atoms, that is, varies with band gap. Specifically, the content of hydrogen and/or halogen atoms is lower in a region where the band gap is narrower.

Although its detailed mechanism has not been understood, the inventors assume the mechanism to be as follows. When an alloy semiconductor containing silicon atoms and germanium atoms is deposited by the method of the present invention for forming a deposited film, the silicon atoms and the germanium atoms have a difference in ionizability which results in a difference between the electromagnetic wave energies obtained by these atoms. This difference facilitates sufficient relaxation even if the alloy semiconductor has a low hydrogen and/or halogen content, so that an excellent alloy semiconductor can be deposited.

The thickness of the i-type layer depends largely on the structure of the photovoltaic device (for example, a single cell, a tandem cell, or a triple cell) and the band gap of the i-type layer. The thickness of first and third i-type layers of the present invention can be 10 to 50 nm, particularly 15 to 40 nm, and more particularly 20 to 30 nm. The thickness of a second i-type layer of the present invention can be 50 nm to 5 μm, particularly 100 nm to 4 μm, and more particularly 150 nm to 3 μm.

The i-type layer, containing silicon atoms or germanium atoms, formed by the method of the present invention for forming a deposited film contains few tail states on the valence band side even if the deposition rate is increased to 2 nm/s or more. The slope of the tail states is 60 meV or less, and the density of dangling bonds is $10^{17}/cm^3$ or less according to electron spin resonance (ESR).

The i-type layer can be designed so that the band gap thereof becomes wider toward the interfaces between the p-type and n-type layers and the i-type layer. This design can increase the photoelectromotive force and photoelectric current of the photovoltaic device and prevent, for example, optical degradation after extended use.

I-Type Amorphous Layer

In the present invention, a stacked photovoltaic device including a unit p-i-n junction device including an i-type microcrystalline silicon layer and a unit p-i-n junction device including an i-type amorphous silicon layer can optionally be formed. In this case, examples of methods suitable for deposition of amorphous silicon include RF plasma-enhanced CVD, VHF plasma-enhanced CVD, and microwave plasma-enhanced CVD. In particular, the deposition rate of amorphous silicon depends on the type of electromagnetic wave used; the deposition rate is higher at a higher frequency for the same amount of energy supplied.

Examples of source gases suitable for supplying silicon atoms to deposit amorphous silicon in the present invention include silane-family source gases such as $SiH_4$, $Si_2H_6$, $SiF_4$, $SiHF_3$, $SiH_2F_2$, $SiH_3F$, $SiH_3Cl$, $SiH_2Cl_2$, $SiHCl_3$, $SiCl_4$, $SiD_4$, $SiHD_3$, $SiH_2D_2$, $SiH_3D$, $SiFD_3$, $SiF_2D_2$, $SiD_3H$, and $Si_2D_3H_3$.

Examples of source gases suitable for supplying germanium atoms to deposit amorphous silicon germanium include $GeH_4$, $GeF_4$, $GeHF_3$, $GeH_2F_2$, $GeH_3F$, $GeHCl_3$, $GeH_2Cl_2$, $GeH_3Cl$, $GeHD_3$, $GeH_2D_2$, $GeH_3D$, $Ge_2H_6$, and $Ge_2D_6$.

Such source gases must be diluted with hydrogen gas to form an excellent amorphous semiconductor. The dilution ratio can be 5 times or more, particularly 5 to 50 times. The source gases can be diluted with helium gas in addition to hydrogen gas.

The substrate temperature at which an amorphous semiconductor appropriate for the present invention can be formed is 100° C. to 500° C. To increase the deposition rate, particularly, the substrate temperature can be controlled to a relatively high temperature.

The pressure in the chamber at which the amorphous semiconductor is deposited in the present invention can be, for example, 0.05 to 500 Pa. In particular, the pressure can be 50 to 300 Pa if the amorphous semiconductor is deposited by VHF plasma-enhanced CVD, and can be 0.1 to 10 Pa if the amorphous semiconductor is deposited by microwave plasma-enhanced CVD.

The power supplied to the chamber to deposit the amorphous semiconductor in the present invention can be, for example, 0.01 to 5 $W/cm^2$. In terms of the relationship between the flow rates of the source gases and the power supplied, a power-limited region, where the deposition rate depends on the power supplied, is appropriate. Alternatively, a flow-limited region, where the deposition rate depends on the flow rates of the gases introduced, is appropriate if priority is given to gas utilization efficiency.

If the rate at which the amorphous semiconductor is deposited is increased, the bias can be controlled so that the substrate is bombarded with ions.

In addition, the content of hydrogen and/or halogen atoms in the amorphous semiconductor in the present invention can be 5% to 30%.

In the photovoltaic device, the i-type layer is an important layer for generating and transporting carriers upon irradiation with light. The i-type layer used can be of slightly p-type or n-type (which depends on the distribution of inherent defects such as tail states).

Semiconductors suitable for the i-type layer of the stacked photovoltaic device of the present invention include semiconductors whose band gap is uniform; semiconductors which contain silicon atoms and germanium atoms and whose band gap varies smoothly in the thickness direction thereof, specifically, semiconductors whose band gap is minimized at a position shifted from the center of the i-type layer toward the interface between the p-type layer and the i-type layer; and semiconductors doped with both a valence electron control agent serving as a donor and a valence electron control agent serving as an acceptor.

In particular, such a distribution pattern can be formed that the content of hydrogen and/or halogen atoms is higher at the interfaces between the p-type and n-type layers and the i-type layer. The content of hydrogen and/or halogen atoms near the interfaces can be, for example, 1.1 to 2 times that in the bulk region of the i-type layer. In addition, it is possible that the content of hydrogen and/or halogen atoms varies with that of silicon atoms. The content of hydrogen and/or halogen atoms in a region where the content of silicon atoms is minimized can be 1 to 10 atomic percent and can be 0.3 to 0.8 times that in a region where the content of hydrogen and/or halogen atoms is maximized. If the i-type layer contains both hydrogen atoms and halogen atoms, the content of halogen atoms can be one tenth or less that of hydrogen atoms.

In this case, the content of hydrogen and/or halogen atoms varies with that of silicon atoms, that is, varies with band gap. Specifically, the content of hydrogen and/or halogen atoms is lower in a region where the band gap is narrower.

Although its detailed mechanism has not been understood, the inventors assume the mechanism to be as follows. When an alloy semiconductor containing silicon atoms and germanium atoms is deposited by the method of the present invention for forming a deposited film, the silicon atoms and the germanium atoms have a difference in ionizability which results in a difference between the electromagnetic wave energies obtained by these atoms. This difference facilitates sufficient relaxation even if the alloy semiconductor has a low hydrogen and/or halogen content, so that an excellent alloy semiconductor can be deposited.

The thickness of the i-type layer depends largely on the structure of the photovoltaic device (for example, a single cell, a tandem cell, or a triple cell) and the band gap of the i-type layer. The thickness of the i-type layer can be, for example, 0.05 to 5 μm.

The i-type layer, containing silicon atoms or germanium atoms, formed by the method of the present invention for forming a deposited film contains few tail states on the valence band side even if the deposition rate is increased to 2 nm/s or more. The slope of the tail states is 60 meV or less, and the density of dangling bonds is $5 \times 10^{17}/cm^3$ or less according to ESR.

The i-type layer can be designed so that the band gap thereof becomes wider toward the interfaces between the p-type and n-type layers and the i-type layer. This design can increase the photoelectromotive force and photoelectric current of the photovoltaic device and prevent, for example, optical degradation after extended use.

Transparent Electrode

A transparent electrode formed of indium oxide or indium tin oxide, for example, is suitable.

The transparent electrode can be deposited by, for example, sputtering or vacuum deposition. If an indium-oxide transparent electrode is formed on the substrate using a DC magnetron sputtering apparatus, metallic indium (In) or indium oxide ($In_2O_3$), for example, can be used as a target.

If an indium-tin-oxide transparent electrode is formed on the substrate, the following materials can be used in combination: metallic tin, metallic indium, an alloy of metallic tin and metallic indium, tin oxide, indium oxide, and indium tin oxide, for example.

The substrate temperature, an important factor in deposition by sputtering, can be, for example, 25° C. to 600° C. The sputtering gas used can be, for example, an inert gas such as argon (Ar) gas, neon (Ne) gas, xenon (Xe) gas, or helium (He) gas, particularly argon (Ar) gas. Oxygen ($O_2$) gas can optionally be added to the inert gas. In particular, oxygen ($O_2$) gas must be added if a metal target is used.

The pressure in the discharge space can be controlled within 0.05 to 10 Pa for effective sputtering using the above inert gas. In addition, the power supply used for sputtering can be a DC power supply or an RF power supply, and the power used for sputtering can be 10 to 1,000 W.

The rate at which the transparent electrode is deposited can be 0.01 to 10 nm/s, depending on the pressure in the discharge space and the discharge power.

The transparent electrode can be deposited to such a thickness that it meets the requirements as an antireflection coating. Specifically, the transparent electrode can be deposited to a thickness of, for example, 50 to 300 nm.

Examples of vapor deposition sources suitable for deposition of the transparent electrode by vacuum deposition include metallic tin, metallic indium, and indium-tin alloy.

The substrate temperature at which the transparent electrode is deposited can be, for example, 25° C. to 600° C.

When the transparent electrode is deposited, oxygen ($O_2$) gas must be introduced into the deposition chamber within the range of $5 \times 10^{-3}$ to $9 \times 10^{-2}$ Pa after the pressure in the deposition chamber is reduced to $10^{-4}$ Pa or less. Introduction of oxygen within this range allows metal evaporated from the vapor deposition source to react with the oxygen in the gas phase, thus depositing an excellent transparent electrode.

The vapor deposition can also be performed with plasma generated by introducing RF power at the above pressure.

The rate at which the transparent electrode is deposited under the above conditions can be 0.01 to 10 nm/s. A deposition rate of less than 0.01 nm/s results in decreased productivity while a deposition rate of more than 10 nm/s results in formation of a rough film with decreased transmittance, conductivity, and adhesiveness.

Collector Electrode

In the present invention, a collector electrode is optionally formed as part of the transparent electrode if its resistivity cannot be sufficiently decreased. The collector electrode functions to decrease the resistivity of the transparent electrode and thus to decrease the series resistance of photovoltaic devices.

Examples of the material of the collector electrode include metals such as gold, silver, copper, aluminum, nickel, iron, chromium, molybdenum, tungsten, titanium, cobalt, tantalum, niobium, and zirconium. Other examples include alloys such as stainless steel and conductive pastes containing powdered metal. The collector electrode is formed in an interdigital pattern (comb pattern) so that the maximum quantity of light can enter the semiconductor layer.

The area of the collector electrode can be 15% or less, particularly 10% or less, and more particularly 5% or less, of the total area of the photovoltaic device.

The pattern of the collector electrode is formed using a mask. The collector electrode is formed by, for example, vapor deposition, sputtering, plating, or printing.

A photovoltaic apparatus having desired output voltage and output current can be produced using stacked photovoltaic devices of the present invention by, for example, connecting the photovoltaic devices of the present invention in series or in parallel, forming protective layers on the top and bottom surfaces thereof, and attaching output electrodes. If the photovoltaic devices of the present invention are connected in series, a diode can optionally be incorporated to prevent backflow.

EXAMPLES

The present invention will now be described in more detail with reference to the examples below, although the invention is not limited to these examples.

The solar-cell characteristics of photovoltaic devices having the single p-i-n structure shown in FIG. 1 and including microcrystalline silicon films of the present invention as i-type layers are measured in Examples 1 to 4 and Comparative Examples 1 and 2 below.

The relationship between the conditions where i-type layers, p/i buffer layers, and n/i buffer layers are formed and the state of occurrence of sparks is determined in advance by a preliminary experiment. The i-type layers are formed under conditions controlled on the basis of the relationship determined by the preliminary experiment to compare samples produced at different rates of occurrence of sparks.

Sparks occurring on a high-frequency electrode or a substrate are detected using a spark detector such as an oscilloscope (detecting step), and the detection results are stored in a memory as data. When a semiconductor device is produced, a deposited film is formed under conditions determined on the basis of the detection results stored in the memory. Specifically, at least one condition selected from the group consisting of high-frequency power, bias voltage, bias current, pressure, gas flow rate, and interelectrode distance is controlled so that the number of sparks with durations of 100 ms or more is 1 or less sparks per minute (controlling step).

Figure 11:
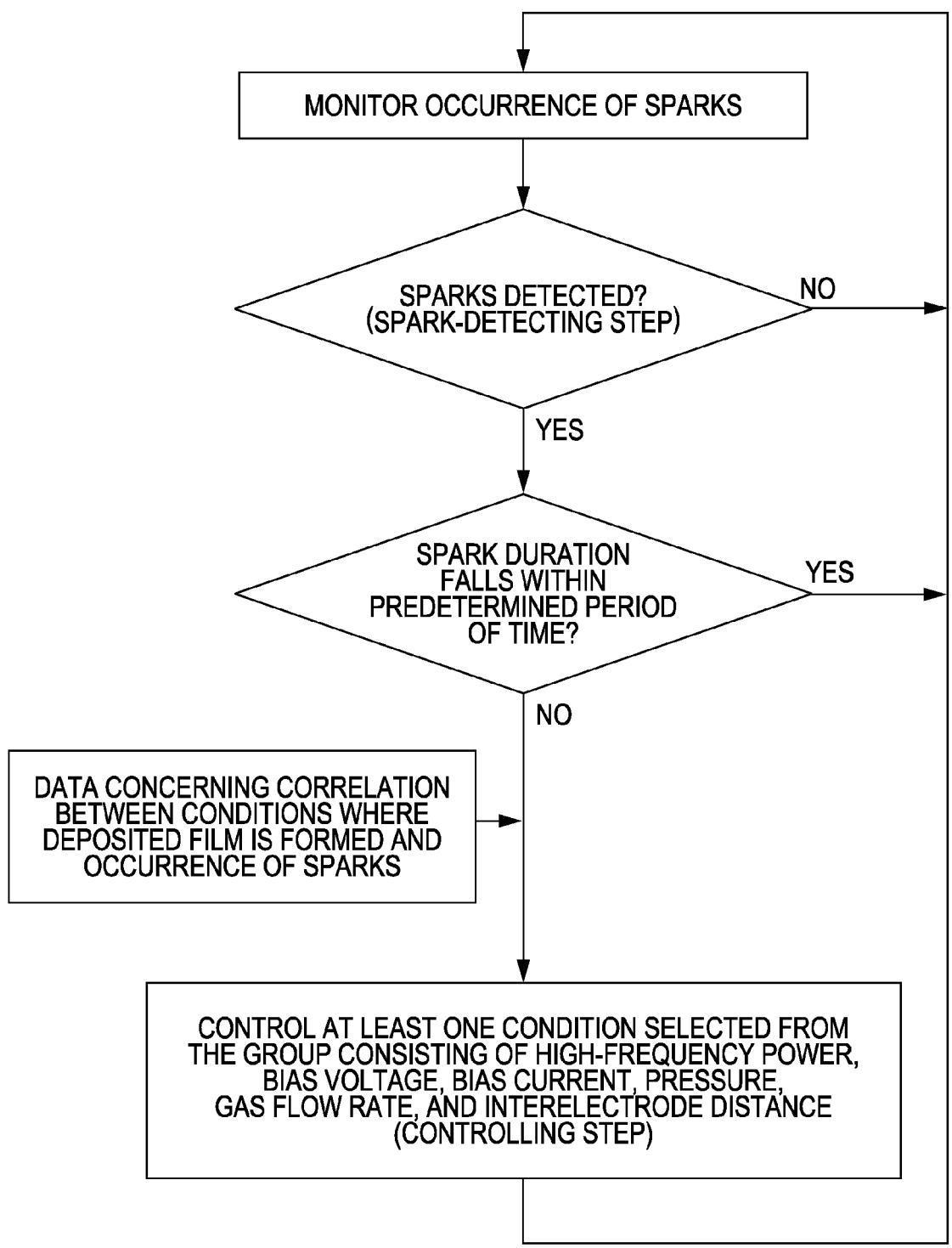
FIG. 11 is a flowchart of steps of a method of the present invention for forming a semiconductor device.

The detecting and controlling steps of the present invention will now be described in more detail with reference to FIG. 11. FIG. 11 is a flowchart of steps of a method of the present invention for forming a semiconductor device.

When a semiconductor device of the present invention is formed by plasma-enhanced CVD, variations in bias voltage and bias current are examined during the formation of a deposited film using a spark detector, such as an oscilloscope, connected to a high-frequency electrode or a matching box. Occurrence of sparks is detected according to variations in bias voltage and bias current (detecting step). According to the duration of the detected sparks, a determination is made as to whether or not the sparks should be suppressed by the present invention (sparks having an adverse effect on the deposited film). If the sparks do not have to be suppressed by the present invention (for example, sparks with durations of 20 μs or less), the parameters including high-frequency power, bias voltage, bias current, pressure, gas flow rate, and interelectrode distance are not controlled or are slightly controlled so as to reduce the possibility of occurrence of sparks. The monitoring of the occurrence of sparks is then continued.

If the sparks detected should be suppressed by the present invention (sparks having an adverse effect on the deposited film), at least one condition selected from the group consisting of high-frequency power, bias voltage, bias current, pressure, gas flow rate, and interelectrode distance is controlled so as to suppress the occurrence of sparks (controlling step). The parameters are controlled based on correlation data obtained in advance by, for example, measurement or simulation. This data concerns the correlation between the conditions where the deposited film is formed and the occurrence of sparks (correlation data concerning how the parameters are controlled to suppress the occurrence of sparks). The occurrence of sparks is monitored again after the control of the parameters. This operation is repeated until the occurrence of sparks is suppressed (the number of sparks with durations of 100 ms or more becomes 1 or less sparks per minute). This allows effective suppression of extremely small sparks. The individual parameters can be controlled by the same methods as described above.

Example 1

A strip-like stainless (SUS430BA) substrate (width: 40 cm; length: 200 m; thickness: 0.125 mm) is sufficiently degreased and cleaned and is inserted into a continuous sputtering apparatus (not shown). A silver film is deposited to a thickness of 100 nm on the substrate by sputtering using a silver electrode as a target. A ZnO film is then deposited to a thickness of 1.2 μm on the silver film by sputtering using a ZnO target. Thus, a strip-like conductive substrate is prepared.

Next, n-type, i-type, and p-type semiconductor layers are sequentially deposited on the substrate by the procedure described above under the conditions shown in Table 1. An ITO transparent conductive film is deposited to a thickness of 80 nm on each n-i-p photoelectric conversion unit as a front electrode by sputtering using a sputtering apparatus (not shown). An interdigital silver electrode for outputting current is then deposited on the transparent conductive film by vapor deposition. Thus, samples of solar cells (single cell) having the p-i-n structure shown in FIG. 1 are produced.

The deposition pressure and the gas flow rate at which the i-type layer, the p/i buffer layer, and the n/i buffer layer are deposited are changed on the basis of the results of the preliminary experiment so that the number of sparks with durations of 100 ms or more is substantially 0 sparks and the number of sparks with durations of 20 to 50 μs is 10 or less sparks per minute.

The n-type layer has a thickness of 20 nm. The n/i buffer layer has a thickness of 10 nm. The p/i buffer layer has a thickness of 10 nm. The p-type layer has a thickness of 5 nm.

The buffer layers are formed without applying a bias to examine the effect of the present invention on the i-type layer.

In Table 1, the symbol RF for high-frequency power means an RF power with a frequency of 13.56 MHz, and the symbol VHF means a VHF power with a frequency of 60 MHz. The bias voltage applied to the high-frequency electrode is negative with respect to a ground potential.

TABLE 1

| | N-type layer | N/i buffer layer | I-type layer | P/i buffer layer | P-type layer |
|---|---|---|---|---|---|
| Gas species and flow rate | | | | | |
| $SiH_4$ (sccm) | 30 | 17 | 500 | 45 | 50 |
| $SiF_4$ (sccm) | | | 200 | | |
| $H_2$ (sccm) | 3,600 | 1,000 to 4,000 | 2,000 to 10,000 | 100 to 450 | 15,000 |
| $PH_3$ (%) | 5 | | | | |
| $BF_3$ (%) | | | | | 30 |
| Bias voltage (V) | 0 | 0 | 0 to −500 | 0 | 0 |
| Substrate temperature (° C.) | 220 | 250 | 200 | 220 | 150 |
| Pressure (Pa) | 1,000 | 600 to 1,500 | 600 to 1,500 | 600 to 1,500 | 1,000 |
| High-frequency power (kW) | 0.2 (RF) | 1.2 (VHF) | 6 (VHF) | 0.2 (RF) | 1.5 (RF) |
| Interelectrode distance (mm) | 10 | 15 | 10 | 15 | 10 |
| Thickness (nm) | 20 | 10 | 2,000 | 10 | 5 |

The photoelectric conversion efficiency, short-circuit current ($J_{sc}$) open-circuit voltage ($V_{oc}$), and fill factor of each sample are measured using a solar simulator (AM 1.5; 100 mW/cm$^2$). Subsequently, each sample is irradiated with AM 1.5 spectrum light at a light intensity of 1 sun for 1,000 hours while being maintained at 50° C. After the irradiation, the individual characteristics of each sample are measured in the same manner as before the irradiation to determine its optical degradation rate.

In addition to the above solar cell samples having the p-i-n structure, samples are produced by forming only i-type layers on a substrate under the same conditions as in Table 1.

η (Photoelectric Conversion Efficiency)
  A: 7% or more
  B: 6% to less than 7%
  C: 5% to less than 6%
  D: less than 5% or not measurable Optical Degradation Rate
  A: less than 5%
  B: 5% to less than 7%
  C: 7% to less than 10%
  D: 10% or more or not measurable

TABLE 2

| | Example 1 | Example 2 | Example 3 | Example 4 | Comparative Example 1 | Comparative Example 2 |
|---|---|---|---|---|---|---|
| $V_{oc}$ | A | A | A | B | C | D: substrate fractured |
| $J_{sc}$ | A | A | B | B | C | D: substrate fractured |
| FF | B | B | B | C | D | D: substrate fractured |
| η | A | B | B | B | D | D: substrate fractured |
| Optical degradation rate | B | B | B | B | D | D: substrate fractured |

The results are shown in Table 2.
The letters A to D shown in Table 2 indicate:

$J_{sc}$ (Short-Circuit Current)
  A: 25 mA/cm$^2$ or more
  B: 20 mA/cm$^2$ to less than 25 mA/cm$^2$
  C: 15 mA/cm$^2$ to less than 20 mA/cm$^2$
  D: less than 15 mA/cm$^2$ or not measurable $V_{oc}$ (Open-Circuit Voltage)
  A: 0.5 V or more
  B: 0.4 V to less than 0.5 V
  C: 0.3 V to less than 0.4 V
  D: less than 0.3 V or not measurable FF (Fill Factor)
  A: 0.5 or more
  B: 0.4 to less than 0.5
  C: 0.3 to less than 0.4
  D: less than 0.3 or not measurable Example 2

Samples are produced under the same conditions as in Example 1 except that the deposition pressure and the gas flow rate at which the i-type layer, the p/i buffer layer, and the n/i buffer layer are deposited are changed on the basis of the results of the preliminary experiment so that the number of sparks with durations of 100 ms or more is substantially 0 sparks and the number of sparks with durations of 50 μs to 20 ms is 5 or less sparks per minute. These samples are evaluated as in Example 1.

The results are shown in Table 2 together with the results of Example 1.

Example 3

Samples are produced under the same conditions as in Example 1 except that the deposition pressure and the gas flow rate at which the i-type layer, the p/i buffer layer, and the n/i buffer layer are deposited are changed on the basis of the results of the preliminary experiment so that the number of sparks with durations of 100 ms or more is substantially 0 sparks and the number of sparks with durations of 20 to 100 ms is 3 or less sparks per minute. These samples are evaluated as in Example 1.

The results are shown in Table 2 together with the results of Example 1.

Example 4

Samples are produced under the same conditions as in Example 1 except that the deposition pressure and the gas flow rate at which the i-type layer, the p/i buffer layer, and the n/i buffer layer are deposited are changed on the basis of the results of the preliminary experiment so that the number of sparks with durations of 100 ms or more is 1 or less sparks per minute. These samples are evaluated as in Example 1.

The results are shown in Table 2 together with the results of Example 1.

Comparative Example 1

Samples are produced under the same conditions as in Example 1 except that the deposition pressure and the gas flow rate at which the i-type layer, the p/i buffer layer, and the n/i buffer layer are deposited are changed on the basis of the results of the preliminary experiment so that the number of sparks with durations of 100 ms to 1 s is 2 or more sparks per minute. These samples are evaluated as in Example 1.

The results are shown in Table 2 together with the results of Example 1.

Comparative Example 2

Samples are produced under the same conditions as in Example 1 except that the deposition pressure and the gas flow rate at which the i-type layer, the p/i buffer layer, and the n/i buffer layer are deposited are changed on the basis of the results of the preliminary experiment so that the number of sparks with durations of 1 s or more is 1 or more sparks per minute. These samples are evaluated as in Example 1.

The results are shown in Table 2 together with the results of Example 1.

Table 2 shows that the photovoltaic devices produced under the conditions of the present invention where a deposited film is deposited have a high conversion efficiency and a low optical degradation rate.

Example 5

Samples are produced under the same conditions as in Example 1, with the duration and number of sparks controlled as in Example 1, except that the samples are solar cells having the p-i-n structure shown in FIG. 2 (double cell). These samples, evaluated as in Example 1, provide excellent results as in Example 1.

Example 6

Samples are produced under the same conditions as in Example 1, with the duration and number of sparks controlled as in Example 1, except that the samples are solar cells having the p-i-n structure shown in FIG. 3 (triple cell). These samples, evaluated as in Example 1, provide excellent results as in Example 1.

Example 7

Samples are produced under the same conditions as in Example 1, with the duration and number of sparks controlled as in Example 1, except that the samples are solar cells having the p-i-n structure shown in FIG. 4 (double cell). These samples, evaluated as in Example 1, provide excellent results as in Example 1.

Examples 8 to 12

Single cells having the structure shown in FIG. 1 are produced in the same manner as in Example 1 except that the bias voltage is changed within the range shown in Table 3 during the formation of the p/i buffer layer and the n/i buffer layer to reduce cation damage. The bias voltage applied to the i-type layer is −60 V.

The solar-cell characteristics of the samples thus produced are measured and evaluated as in Example 1. Also, the state of occurrence of sparks is examined when the bias applied to the buffer layers is changed. The results are shown in Table 4 together with the results of Example 1 for comparison.

The letters A to E in the "Spark" row of Table 4 indicate the following results:

A: the number of sparks with durations of 100 ms or more is substantially 0 sparks, and the number of sparks with durations of 20 to 50 μs is 10 or less sparks per minute;

B: the number of sparks with durations of 100 ms or more is substantially 0 sparks, and the number of sparks with durations of 50 μs to 20 ms is 5 or less sparks per minute;

C: the number of sparks with durations of 100 ms or more is substantially 0 sparks, and the number of sparks with durations of 20 to 100 ms is 3 or less sparks per minute;

D: the number of sparks with durations of 100 ms or more is 1 or less sparks per minute; and E: the number of sparks with durations of 100 ms or more is 2 or more sparks per minute.

The magnitude of cation damage is not uniquely determined by bias voltage, but varies with, for example, interelectrode distance and pressure; however, these examples are performed under such conditions that the magnitude of cation damage depended predominantly on bias voltage.

TABLE 3

|  | N-type layer | N/i buffer layer | I-type layer | P/i buffer layer | P-type layer |
|---|---|---|---|---|---|
| Gas species and flow rate |  |  |  |  |  |
| $SiH_4$ (sccm) | 30 | 17 | 500 | 45 | 50 |
| $SiF_4$ (sccm) |  |  | 200 |  |  |
| $H_2$ (sccm) | 3,600 | 1,000 to 4,000 | 2,000 to 10,000 | 100 to 450 | 15,000 |
| $PH_3$ (%) | 5 |  |  |  |  |
| $BF_3$ (%) |  |  |  |  | 30 |
| Bias voltage (V) | 0 | 0 to −500 | −60 | 0 to −500 | 0 |
| Substrate temperature (° C.) | 220 | 250 | 200 | 220 | 150 |

TABLE 3-continued

|  | N-type layer | N/i buffer layer | I-type layer | P/i buffer layer | P-type layer |
|---|---|---|---|---|---|
| Pressure (Pa) | 1,000 | 600 to 1,500 | 600 to 1,500 | 600 to 1,500 | 1,000 |
| High-frequency power (kW) | 0.2 (RF) | 1.2 (VHF) | 6 (VHF) | 0.2 (RF) | 1.5 (RF) |
| Interelectrode distance (mm) | 10 | 15 | 10 | 15 | 10 |
| Thickness (nm) | 20 | 10 | 2,000 | 10 | 5 |

TABLE 4

|  | Example 1 | Example 8 | Example 9 | Example 10 | Example 11 | Example 12 | Comparative Example 3 |
|---|---|---|---|---|---|---|---|
| Bias voltage | 0 | −60 | −100 | −200 | −300 | −400 | −500 |
| Spark | A | A | A | B | C | D | E |
| $V_{oc}$ | A | A | A | A | A | B | C |
| $J_{sc}$ | A | A | A | A | A | A | C |
| FF | B | B | A | A | B | B | D |
| η | A | A | A | A | A | A | D |
| Optical degradation rate | B | B | A | A | B | B | D |

Comparative Example 3

Samples of Comparative Example 3 are produced with the bias voltage changed during the formation of the p/i buffer layer and the n/i buffer layer, as in Examples 8 to 12, but the number and duration of sparks are beyond the scope of the present invention. These samples are evaluated as in Examples 8 to 12. The results are shown in Table 4 together with the results of Examples 8 to 12.

Table 4 shows that the FF is improved and the optical degradation rate is reduced by applying a higher bias voltage during the formation of the p/i buffer layer and the n/i buffer layer than during the formation of the i-type layer, so that cation damage occurring during the formation of the buffer layers (interface layers) is smaller than that occurring during the formation of the i-type layer (bulk layer).

Example 13

Samples are produced under the same conditions as in Examples 8 to 12, with the duration and number of sparks controlled as in Examples 8 to 12, except that the samples are solar cells having the p-i-n structures shown in FIGS. 2 to 4 (double or triple cell). These samples are evaluated as in Examples 8 to 12, and provide excellent results as in Examples 8 to 12.

The above results demonstrate that the effect of the present invention can be achieved irrespective of the layer structure of a solar cell.

While the present invention has been described with reference to exemplary embodiments, it is to be understood that the invention is not limited to those embodiments. The scope of the following claims is to be accorded the broadest interpretation so as to encompass all modifications, equivalent structures and functions.

This application claims the benefit of Japanese Application No. 2006-278918 filed Oct. 12, 2006, and No. 2007-219926 filed Aug. 27, 2007, which are hereby incorporated by reference herein in their entirety.

What is claimed is:

1. A method for forming a semiconductor device, including a semiconductor layer comprising a silicon-based deposited film containing crystals, by plasma-enhanced CVD, the method comprising the steps of:

applying a bias voltage between a high-frequency electrode and a substrate with the high-frequency electrode being negative when the semiconductor layer is formed;
detecting sparks occurring on the high-frequency electrode or the substrate; and
controlling at least one condition selected from the group consisting of high-frequency power, bias voltage, bias current, pressure, gas flow rate, and interelectrode distance, based on the results of the detection so that the number of sparks with durations of 100 ms or more is 1 or less sparks per minute.

2. The method for forming the semiconductor device according to claim 1, wherein the semiconductor layer is a substantially i-type semiconductor layer and forms a semiconductor junction with a p-type semiconductor layer or an n-type semiconductor layer.

3. The method for forming the semiconductor device according to claim 2, wherein the i-type layer is formed by two or more steps including a first step of forming a first i-type layer in contact with the p-type layer or the n-type layer and a second step of forming a second i-type layer on the first i-type layer, the first step being performed under such conditions that cation damage due to the sparks is smaller in the first step than in the second step.

4. The method for forming the semiconductor device according to claim 3, wherein at least one condition selected from the group consisting of bias voltage and bias current is controlled so that the cation damage due to the sparks is smaller in the first step than in the second step.

5. The method for forming the semiconductor device according to claim 3, wherein the i-type layer is formed at a pressure of 1,000 Pa or more and an interelectrode distance of 10 mm or less.

6. The method for forming the semiconductor device according to claim 3, wherein the first i-type layer is thinner than the second i-type layer.

7. The method for forming the semiconductor device according to claim 3, wherein the first i-type layer has a thickness of 10 to 50 nm and the second i-type layer has a thickness of 50 nm to 5 μm.

8. The method for forming the semiconductor device according to claim 2, wherein the i-type layer is formed by three or more steps including a first step of forming a first i-type layer in contact with the n-type layer, a second step of forming a second i-type layer on the first i-type layer, and a third step of forming a third i-type layer on the second i-type layer so as to be in contact with the p-type layer, the first and third steps being performed under such conditions that cation damage due to the sparks is smaller in the first and third steps than in the second step.

9. The method for forming the semiconductor device according to claim 8, wherein at least one condition selected from the group consisting of bias voltage and bias current is controlled so that cation damage due to the sparks is smaller in the first and third steps than in the second step.

10. The method for forming the semiconductor device according to claim 8, wherein the i-type layer is formed at a pressure of 1,000 Pa or more and an interelectrode distance of 10 mm or less.

11. The method for forming the semiconductor device according to claim 8, wherein the first and third i-type layers are thinner than the second i-type layer.

12. The method for forming the semiconductor device according to claim 8, wherein the first and third i-type layers each have a thickness of 10 to 50 nm and the second i-type layer has a thickness of 50 nm to 5 μm.

* * * * *